US011832381B2

(12) United States Patent
Seo et al.

(10) Patent No.: US 11,832,381 B2
(45) Date of Patent: Nov. 28, 2023

(54) ELECTRONIC DEVICE INCLUDING ANTENNA AND HEAT DISSIPATION STRUCTURE

(71) Applicant: Samsung Electronics Co., Ltd., Gyeonggi-do (KR)

(72) Inventors: Seunghan Seo, Gyeonggi-do (KR); Jongpill Lee, Gyeonggi-do (KR); Changwon Jang, Gyeonggi-do (KR)

(73) Assignee: Samsung Electronics Co., Ltd

( * ) Notice: Subject to any disclaimer, the term of this patent is extended or adjusted under 35 U.S.C. 154(b) by 0 days.

(21) Appl. No.: 17/974,083

(22) Filed: Oct. 26, 2022

(65) Prior Publication Data

US 2023/0049711 A1 Feb. 16, 2023

Related U.S. Application Data

(63) Continuation of application No. 17/460,588, filed on Aug. 30, 2021, now Pat. No. 11,516,903, which is a (Continued)

(30) Foreign Application Priority Data

Apr. 15, 2019 (KR) ........................ 10-2019-0043503

(51) Int. Cl.
*H05K 1/02* (2006.01)
*H01Q 1/24* (2006.01)
*H01Q 1/22* (2006.01)

(52) U.S. Cl.
CPC ........... *H05K 1/021* (2013.01); *H01Q 1/2283* (2013.01); *H01Q 1/243* (2013.01); *H05K 1/0224* (2013.01); *H05K 2201/10098* (2013.01)

(58) Field of Classification Search
CPC ..................................................... H05K 1/021
See application file for complete search history.

(56) References Cited

U.S. PATENT DOCUMENTS

| | | | |
|---|---|---|---|
| 2007/0159380 | A1 | 7/2007 | Nagaishi et al. |
| 2014/0104127 | A1 | 4/2014 | Orihara et al. |

(Continued)

FOREIGN PATENT DOCUMENTS

| | | |
|---|---|---|
| CN | 102427159 | 4/2012 |
| CN | 107078405 | 8/2017 |

(Continued)

OTHER PUBLICATIONS

International Search Report dated Jul. 22, 2020 issued in counterpart application No. PCT/KR2020/004958, 7 pages.

(Continued)

*Primary Examiner* — Rafferty D Kelly
(74) *Attorney, Agent, or Firm* — The Farrell Law Firm, P.C.

(57) ABSTRACT

Electronic device includes a housing; an antenna module accommodated in the housing, the antenna module including a PCB including a first side and a second side opposite to the first side; one or more antenna elements disposed at the first side of the PCB; and a wireless communication circuit disposed at the second side of the PCB and configured to transmit and/or receive a radio signal through an antenna element of the one or more antenna elements; and a conductive member accommodated in the housing and including a supporting portion and a connecting portion extended from the supporting portion and connected to the conductive portion of the housing, the supporting portion configured to support the antenna module such that the first side of the PCB faces in a direction toward the lateral surface of the electronic device, and the connecting portion including a hole through which a fastening member is disposed to fasten (Continued)

the conductive member to the conductive portion of the housing. Heat generated by the antenna module is transferred to the conductive portion of the housing.

17 Claims, 19 Drawing Sheets

Related U.S. Application Data continuation of application No. 16/848,121, filed on Apr. 14, 2020, now Pat. No. 11,160,161.

(56) References Cited

U.S. PATENT DOCUMENTS

| | | | |
|---|---|---|---|
| 2015/0123860 A1 | 5/2015 | Park et al. | |
| 2015/0214598 A1 | 7/2015 | Fujita et al. | |
| 2016/0049723 A1 | 2/2016 | Baks et al. | |
| 2017/0062899 A1* | 3/2017 | Takahashi | H01Q 1/02 |
| 2017/0062906 A1 | 3/2017 | McAuliffe et al. | |
| 2017/0222316 A1 | 8/2017 | Mizunuma et al. | |
| 2018/0035528 A1 | 2/2018 | Kim et al. | |
| 2018/0089551 A1 | 3/2018 | Orihara et al. | |
| 2018/0212307 A1 | 7/2018 | Kim et al. | |
| 2020/0266521 A1 | 8/2020 | Jeong et al. | |

FOREIGN PATENT DOCUMENTS

| | | |
|---|---|---|
| CN | 107105596 | 8/2017 |
| EP | 1 777 551 | 4/2007 |
| EP | 3 729 561 | 10/2020 |
| EP | 3 744 077 | 9/2022 |
| JP | 6341293 | 5/2018 |
| KR | 2018-0087095 | 8/2018 |
| RU | 2 600 528 | 10/2016 |
| WO | WO 2016-063759 | 4/2016 |

OTHER PUBLICATIONS

Chinese Office Action dated Jul. 12, 2021 issued in counterpart application No. 202080001111.8, 21 pages.
European Search Report dated Dec. 16, 2022 issued in counterpart application No. 22188297.0-1205, 13 pages.
Russian Office Action dated Aug. 3, 2023 issued in counterpart application No. 2021129868/07, 12 pages.
Vietnamese Office Action dated Sep. 11, 2023 issued in counterpart application No. 1-2020-03183, 3 pages.
Korean Office Action dated Jul. 3, 2023 issued in counterpart application No. 10-2019-0043503, 14 pages.

* cited by examiner

ELECTRONIC DEVICE INCLUDING ANTENNA AND HEAT DISSIPATION STRUCTURE

CROSS-REFERENCE TO RELATED APPLICATION(S)

This application is a Continuation of U.S. application Ser. No. 17/460,588, which was filed in the U.S. Patent and Trademark Office (USPTO) on Aug. 30, 2021, which is a Continuation of U.S. application Ser. No. 16/848,121, which was filed in the USPTO on Apr. 14, 2020, issued as U.S. Pat. No. 11,160,161 on Oct. 26, 2021, and claims priority under 35 U.S.C. § 119 to Korean Patent Application No. 10-2019-0043503, which was filed in the Korean Intellectual Property Office on Apr. 15, 2019, the entire disclosure of each of which is incorporated herein by reference.

BACKGROUND

1. Field

The disclosure relates to an electronic device including an antenna and a heat dissipation structure.

2. Description of Related Art

With the development of wireless communication technology, electronic devices (e.g., communication electronic devices) are commonly used in daily life; thus, use of contents is increasing exponentially. Because of such rapid increase in the use of contents, a network capacity is reaching its limit. After commercialization of 4th generation (4G) communication systems, in order to meet growing wireless data traffic demand, a communication system (e.g., 5th generation (5G) or pre-5G communication system, or new radio (NR))) that transmits and/or receives signals using a frequency of a high frequency (e.g., millimeter wave (mmWave)) band (e.g., 3 GHz to 300 GHz band) is being studied.

Next-generation wireless communication technologies are currently being developed to permit signal transmission/reception using frequencies in the range of 3 GHz to 100 GHz, overcome a high free space loss due to frequency characteristics, implement an efficient mounting structure for increasing an antenna gain, and realize a related new antenna module. This antenna module may include an array-type antenna module in which various numbers of antenna elements (e.g., conductive patches) are arranged at regular intervals. These antenna elements may be disposed in an electronic device so as to form a beam pattern in one direction.

The electronic device may include a metal structure such as a conductive lateral member so as to reinforce the rigidity and create a beautiful appearance. This metal structure is disposed as a unit conductive portion between a pair of non-conductive portions (e.g., segments) spaced at a certain distance and is electrically connected to a wireless communication circuit, thus, operating as a legacy antenna module configured to transmit and/or receive a radio signal having a frequency in the range of about 800 MHz to 3000 MHz.

In addition, when the above-described mmWave antenna module and the legacy antenna module are disposed in close proximity to each other, the electronic device may be confronted with a degradation of radiation characteristics of the antenna modules due to mutual signal interference. Moreover, the mmWave antenna module may require an additional heat dissipation structure for not only dissipating heat but also shielding noise generated by transmitting and/or receiving high frequency signals.

SUMMARY

An aspect of the disclosure provides an electronic device that includes an antenna and a heat dissipation structure.

Another aspect of the disclosure provides an electronic device that includes an antenna and a heat dissipation structure configured to perform a function of shielding noise due to signal interference with an antenna module disposed nearby.

According to various embodiments of the disclosure, an electronic device may include a housing including a conductive portion. The electronic device may include an antenna module disposed in an inner space of the housing. The antenna module may include a printed circuit board (PCB) disposed in the inner space and including a first surface and a second surface facing a direction opposite to the first surface, at least one antenna element disposed on the first surface of the PCB or near the first surface in the PCB, a wireless communication circuit disposed on the second surface and configured to transmit and/or receive a radio signal through the at least one antenna element, a protective member disposed on the second surface of the PCB to surround at least partially the wireless communication circuit, and a conductive shielding layer disposed on the protective layer. The electronic device may further include a conductive member connected to the conductive portion of the housing and facing the conductive shielding layer of the antenna module at least in part.

According to various embodiments of the disclosure, an electronic device may include a housing. The electronic device may further include a device substrate disposed in an inner space of the housing and including a first ground layer, and an antenna module disposed adjacent to the device substrate. The antenna module may include a printed circuit board (PCB) disposed in the inner space and including a first surface and a second surface facing a direction opposite to the first surface, at least one antenna element disposed on the first surface of the PCB or near the first surface in the PCB, a wireless communication circuit disposed on the second surface and configured to transmit and/or receive a radio signal through the at least one antenna element, a protective member disposed on the second surface of the PCB to surround at least partially the wireless communication circuit, and a conductive shielding layer disposed on the protective layer. The electronic device may further include a conductive member disposed in the inner space and including a first portion electrically connected to the conductive shielding layer and a second portion connected to the first portion and electrically connected to the first ground layer of the device substrate.

According to various embodiments of the disclosure, a portable communication device may include a housing including a conductive portion forming at least a part of a lateral surface of the portable communication device. The portable communication device may include an antenna module disposed in the housing and including a printed circuit board (PCB) having a first surface facing the lateral surface and a second surface facing a direction opposite to the first surface, one or more antennas disposed on at least a portion of the PCB to transmit or receive a signal through the lateral surface, and a communication circuit disposed on the second surface and electrically connected to the one or more antennas. The portable communication device may further include a shielding member surrounding at least in part the communication circuit, a support member supporting the antenna module and having a conductive material, and an electric shock prevention member positioned to contact the shielding member and the support member. At least a part of a noise generated by the communication circuit in a direction different from a radiation direction of the antenna module may be passed to the support member through the electric shock prevention member, and a current passed to the support member through the electric shock prevention member may be reduced.

According to various embodiments of the disclosure, a portable communication device may include a housing including a conductive portion forming at least a part of a lateral surface of the portable communication device. The portable communication device may include an antenna module disposed in the housing and including a printed circuit board (PCB) having a first surface facing the lateral surface and a second surface facing a direction opposite to the first surface, one or more antennas disposed on at least a portion of the PCB to transmit or receive a signal through the lateral surface, and a communication circuit disposed on the second surface and electrically connected to the one or more antennas. The portable communication device may further include a shielding member surrounding at least in part the communication circuit, a support member supporting the antenna module and having a conductive material, and an electric shock prevention member positioned to contact the shielding member and the support member and having a specific capacitance. An alternating current (AC) coupling may be formed between the shielding member and the support member, based on the specific capacitance.

According to various embodiments of the disclosure, a portable communication device may include an antenna module including a printed circuit board (PCB) having a first surface and a second surface facing a direction opposite to the first surface, one or more antennas disposed on at least a portion of the PCB to transmit or receive a signal through the first surface, and a communication circuit disposed on the second surface and electrically connected to the one or more antennas. The portable communication device may further include a shielding member surrounding at least in part the communication circuit, and an electric shock prevention member positioned to contact the shielding member. At least a part of a noise generated by the communication circuit in a direction different from a radiation direction of the antenna module may be passed through the electric shock prevention member, and a current passed through the electric shock prevention member may be reduced.

According to various embodiments of the disclosure, an antenna module may include a printed circuit board (PCB) having a first surface and a second surface facing a direction opposite to the first surface, one or more antennas disposed on at least a portion of the PCB to transmit or receive a signal through the first surface, a communication circuit disposed on the second surface and electrically connected to the one or more antennas, a shielding member surrounding at least in part the communication circuit, and an electric shock prevention member positioned to contact the shielding member. At least a part of a noise generated by the communication circuit in a direction different from a radiation direction of the antenna module may be passed through the electric shock prevention member, and a current passed through the electric shock prevention member may be reduced.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Embodiments of the disclosure are described below in detail with reference to the accompanying drawings.

Figure 1:
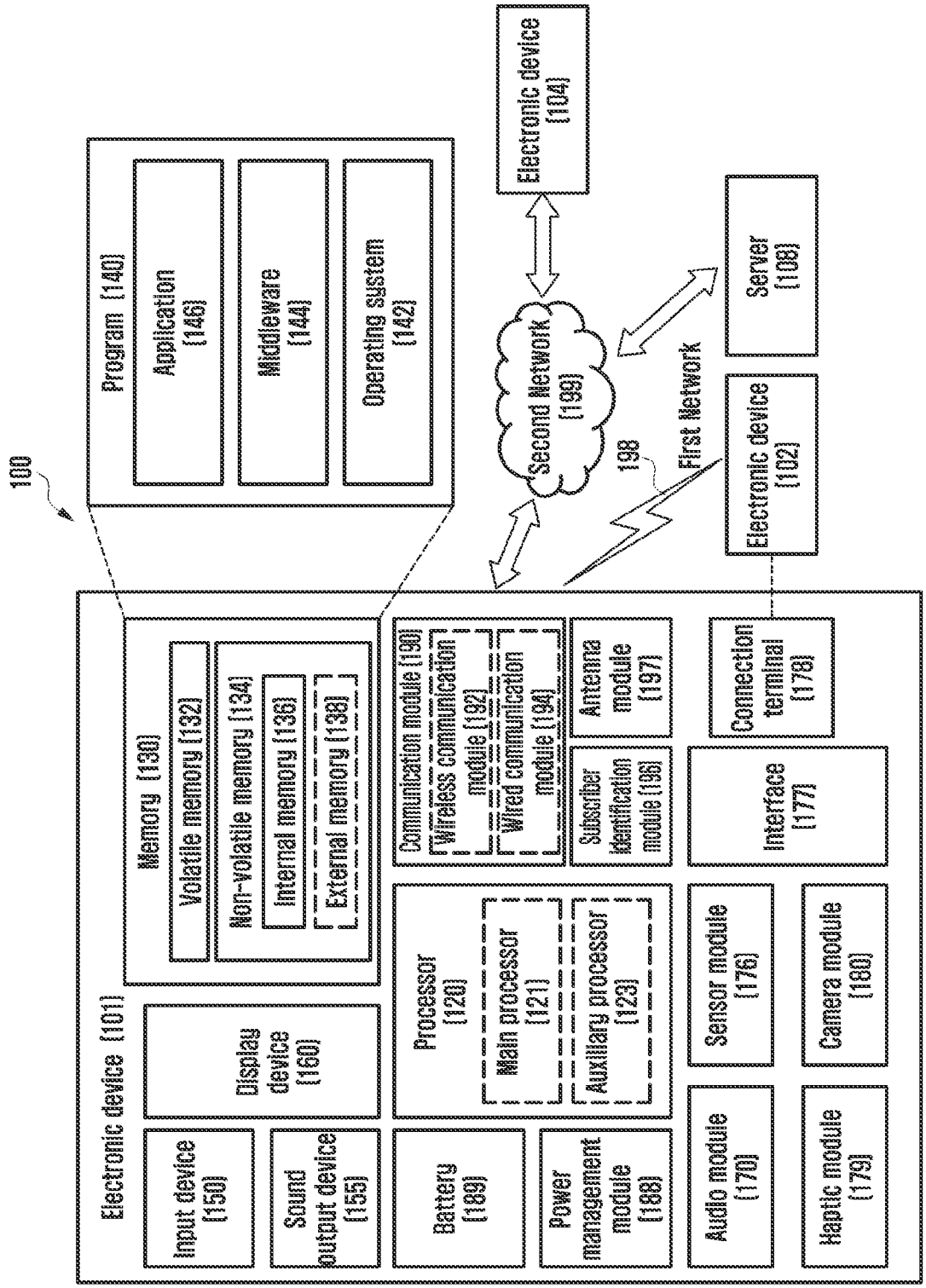
FIG. 1 is a block diagram of an electronic device in a network environment according to an embodiment.

FIG. 1 illustrates an electronic device in a network environment according to an embodiment of the disclosure.

Referring to FIG. 1, an electronic device 101 in a network environment 100 may communicate with an electronic device 102 via a first network 198 (e.g., a short-range wireless communication network), or an electronic device 104 or a server 108 via a second network 199 (e.g., a long-range wireless communication network). The electronic device 101 may communicate with the electronic device 104 via the server 108. The electronic device 101 includes a processor 120, memory 130, an input device 150, an audio output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. As at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. The processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). The auxiliary processor 123 (e.g., an ISP or a CP) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by another component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The audio output device 155 may output sound signals to the outside of the electronic device 101. The audio output device 155 may include, for example, a speaker or a receiver. The speaker may be used for general purposes, such as playing multimedia or playing record, and the receiver may be used for an incoming call. The receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. The display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. The audio module 170 may obtain the sound via the input device 150, or output the sound via the audio output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. The sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. The interface 177 may include, for example, a high definition multimedia interface (HDMI), a universal serial bus (USB) interface, a secure digital (SD) card interface, or an audio interface.

A connection terminal 178 may include a connector via which the electronic device 101 may be physically connected with the external electronic device (e.g., the electronic device 102). The connection terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. The haptic module 179 may include, for example, a motor, a piezoelectric element, or an electric stimulator.

The camera module 180 may capture a still image or moving images. The camera module 180 may include one or more lenses, image sensors, ISPs, or flashes.

The power management module 188 may manage power supplied to the electronic device 101. The power management module 188 may be implemented as at least part of, for example, a power management integrated circuit (PMIC).

The battery 189 may supply power to at least one component of the electronic device 101. The battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more CPs that are operable independently from the processor 120 (e.g., the AP) and supports a direct (e.g., wired) communication or a wireless communication. The communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The antenna module 197 may transmit or receive a signal or power to or from the outside (e.g., the external electronic device) of the electronic device 101. The antenna module 197 may include an antenna including a radiating element composed of a conductive material or a conductive pattern formed in or on a substrate (e.g., a printed circuit board (PCB)). The antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. Another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

Commands or data may be transmitted or received between the electronic device 101 and the external electronic device 104 via the server 108 coupled with the second network 199. Each of the electronic devices 102 and 104 may be a device of a same type as, or a different type, from the electronic device 101. All or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

An electronic device according to an embodiment may be one of various types of electronic devices. The electronic device may include a portable communication device (e.g., a smart phone), a computer device, a portable multimedia device, a portable medical device, a camera, a wearable device, or a home appliance. However, the electronic device is not limited to any of those described above.

Various embodiments of the disclosure and the terms used herein are not intended to limit the technological features set forth herein to particular embodiments and include various changes, equivalents, or replacements for a corresponding embodiment.

With regard to the description of the drawings, similar reference numerals may be used to refer to similar or related elements.

A singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C" may include any one of, or all possible combinations of the items enumerated together in a corresponding one of the phrases.

As used herein, such terms as "$1^{st}$" and "$2^{nd}$", or "first" and "second" may be used to simply distinguish a corresponding component from another, and does not limit the components in other aspect (e.g., importance or order). If an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

The term "module" may include a unit implemented in hardware, software, or firmware, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to an embodiment of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturers server, a server of the application store, or a relay server.

Each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

Figure 2:
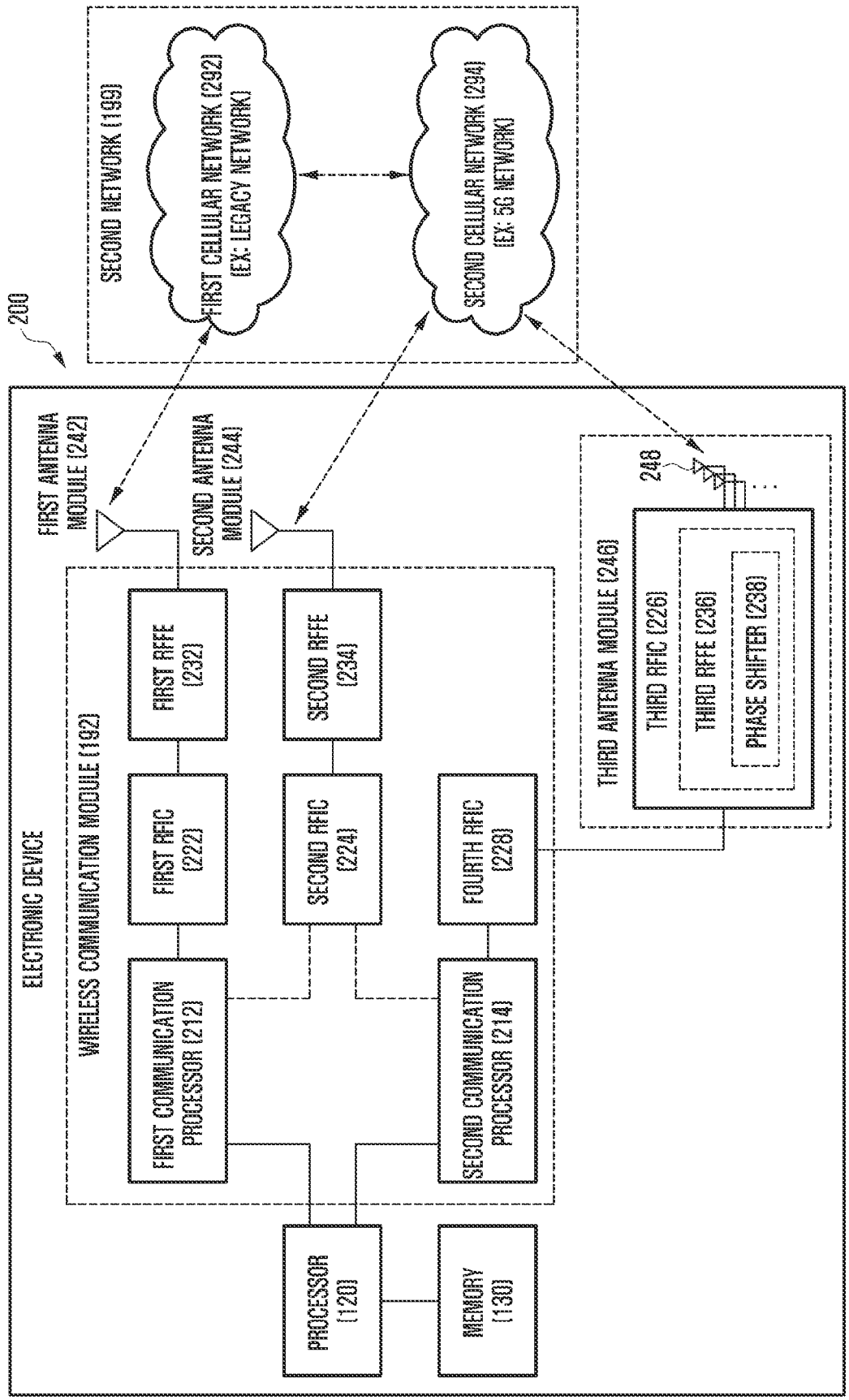
FIG. 2 is a block diagram of an electronic device for supporting a legacy network communication and a 5G network communication according to an embodiment.

FIG. 2 is a block diagram illustrating an electronic device in a network environment including a plurality of cellular networks according to various embodiments of the disclosure.

Referring to FIG. 2, the electronic device 101 may include a first CP 212, second CP 214, first RFIC 222, second RFIC 224, third RFIC 226, fourth RFIC 228, first radio frequency front end (RFFE) 232, second RFFE 234, first antenna module 242, second antenna module 244, and antenna 248. The electronic device 101 may include a processor 120 and a memory 130. A second network 199 may include a first cellular network 292 and a second cellular network 294. According to another embodiment, the electronic device 101 may further include at least one of the components described with reference to FIG. 1, and the second network 199 may further include at least one other network. According to one embodiment, the first CP 212, second CP 214, first RFIC 222, second RFIC 224, fourth RFIC 228, first RFFE 232, and second RFFE 234 may form at least part of the wireless communication module 192. According to another embodiment, the fourth RFIC 228 may be omitted or included as part of the third RFIC 226.

The first CP 212 may establish a communication channel of a band to be used for wireless communication with the first cellular network 292 and support legacy network communication through the established communication channel. According to various embodiments, the first cellular network may be a legacy network including a second generation (2G), 3G, 4G, or long term evolution (LTE) network. The second CP 214 may establish a communication channel corresponding to a designated band (e.g., about 6 GHz to about 60 GHz) of bands to be used for wireless communication with the second cellular network 294, and support 5G network communication through the established communication channel. According to various embodiments, the second cellular network 294 may be a 5G network defined in 3GPP. Additionally, according to an embodiment, the first CP 212 or the second CP 214 may establish a communication channel corresponding to another designated band (e.g., about 6 GHz or less) of bands to be used for wireless communication with the second cellular network 294 and support 5G network communication through the established communication channel. According to one embodiment, the first CP 212 and the second CP 214 may be implemented in a single chip or a single package. According to various embodiments, the first CP 212 or the second CP 214 may be formed in a single chip or a single package with the processor 120, the auxiliary processor 123, or the communication module 190.

Upon transmission, the first RFIC 222 may convert a baseband signal generated by the first CP 212 to a radio frequency (RF) signal of about 700 MHz to about 3 GHz used in the first cellular network 292 (e.g., legacy network). Upon reception, an RF signal may be obtained from the first cellular network 292 (e.g., legacy network) through an antenna (e.g., the first antenna module 242) and be preprocessed through an RFFE (e.g., the first RFFE 232). The first RFIC 222 may convert the preprocessed RF signal to a baseband signal so as to be processed by the first CP 212.

Upon transmission, the second RFIC 224 may convert a baseband signal generated by the first CP 212 or the second CP 214 to an RF signal (hereinafter, 5G Sub6 RF signal) of a Sub6 band (e.g., 6 GHz or less) to be used in the second cellular network 294 (e.g., 5G network). Upon reception, a 5G Sub6 RF signal may be obtained from the second cellular network 294 (e.g., 5G network) through an antenna (e.g., the second antenna module 244) and be pretreated through an RFFE (e.g., the second RFFE 234). The second RFIC 224 may convert the preprocessed 5G Sub6 RF signal to a baseband signal so as to be processed by a corresponding CP of the first CP 212 or the second CP 214.

The third RFIC 226 may convert a baseband signal generated by the second CP 214 to an RF signal (hereinafter, 5G Above6 RF signal) of a 5G Above6 band (e.g., about 6 GHz to about 60 GHz) to be used in the second cellular network 294 (e.g., 5G network). Upon reception, a 5G Above6 RF signal may be obtained from the second cellular network 294 (e.g., 5G network) through an antenna (e.g., the antenna 248) and be preprocessed through the third RFFE 236. The third RFIC 226 may convert the preprocessed 5G Above6 RF signal to a baseband signal so as to be processed by the second CP 214. According to one embodiment, the third RFFE 236 may be formed as part of the third RFIC 226.

According to an embodiment, the electronic device 101 may include a fourth RFIC 228 separately from the third RFIC 226 or as at least part of the third RFIC 226. In this case, the fourth RFIC 228 may convert a baseband signal generated by the second CP 214 to an RF signal (hereinafter, an intermediate frequency (IF) signal) of an intermediate frequency band (e.g., about 9 GHz to about 11 GHz) and transfer the IF signal to the third RFIC 226. The third RFIC 226 may convert the IF signal to a 5G Above 6RF signal. Upon reception, the 5G Above 6RF signal may be received from the second cellular network 294 (e.g., a 5G network) through an antenna (e.g., the antenna 248) and be converted to an IF signal by the third RFIC 226. The fourth RFIC 228 may convert an IF signal to a baseband signal so as to be processed by the second CP 214.

According to one embodiment, the first RFIC 222 and the second RFIC 224 may be implemented into at least part of a single package or a single chip. According to one embodiment, the first RFFE 232 and the second RFFE 234 may be implemented into at least part of a single package or a single chip. According to one embodiment, at least one of the first antenna module 242 or the second antenna module 244 may be omitted or may be combined with another antenna module to process RF signals of a corresponding plurality of bands.

According to one embodiment, the third RFIC 226 and the antenna 248 may be disposed at the same substrate to form a third antenna module 246. For example, the wireless communication module 192 or the processor 120 may be disposed at a first substrate (e.g., main PCB). In this case, the third RFIC 226 is disposed in a partial area (e.g., lower surface) of the first substrate and a separate second substrate (e.g., sub PCB), and the antenna 248 is disposed in another partial area (e.g., upper surface) thereof; thus, the third antenna module 246 may be formed. By disposing the third RFIC 226 and the antenna 248 in the same substrate, a length of a transmission line therebetween can be reduced. This may reduce, for example, a loss (e.g., attenuation) of a signal of a high frequency band (e.g., about 6 GHz to about 60 GHz) to be used in 5G network communication by a transmission line. Therefore, the electronic device 101 may improve a quality or speed of communication with the second cellular network 294 (e.g., 5G network).

According to one embodiment, the antenna 248 may be formed in an antenna array including a plurality of antenna elements that may be used for beamforming. In this case, the third RFIC 226 may include a plurality of phase shifters 238 corresponding to a plurality of antenna elements, for example, as part of the third RFFE 236. Upon transmission, each of the plurality of phase shifters 238 may convert a phase of a 5G Above6 RF signal to be transmitted to the outside (e.g., a base station of a 5G network) of the electronic device 101 through a corresponding antenna element. Upon reception, each of the plurality of phase shifters 238 may convert a phase of the 5G Above6 RF signal received from the outside to the same phase or substantially the same phase through a corresponding antenna element. This enables transmission or reception through beamforming between the electronic device 101 and the outside.

The second cellular network 294 (e.g., 5G network) may operate (e.g., standalone (SA)) independently of the first cellular network 292 (e.g., legacy network) or may be operated (e.g., non-standalone (NSA)) in connection with the first cellular network 292. For example, the 5G network may have only an access network (e.g., 5G radio access network (RAN) or a next generation (NG) RAN and have no core network (e.g., next generation core (NGC)). In this case, after accessing to the access network of the 5G network, the electronic device 101 may access to an external network (e.g., Internet) under the control of a core network (e.g., an evolved packed core (EPC)) of the legacy network. Protocol information (e.g., LTE protocol information) for communication with a legacy network or protocol information (e.g., new radio (NR) protocol information) for communication with a 5G network may be stored in the memory 130 to be accessed by other components (e.g., the processor 120, the first CP 212, or the second CP 214).

Figure 3A:
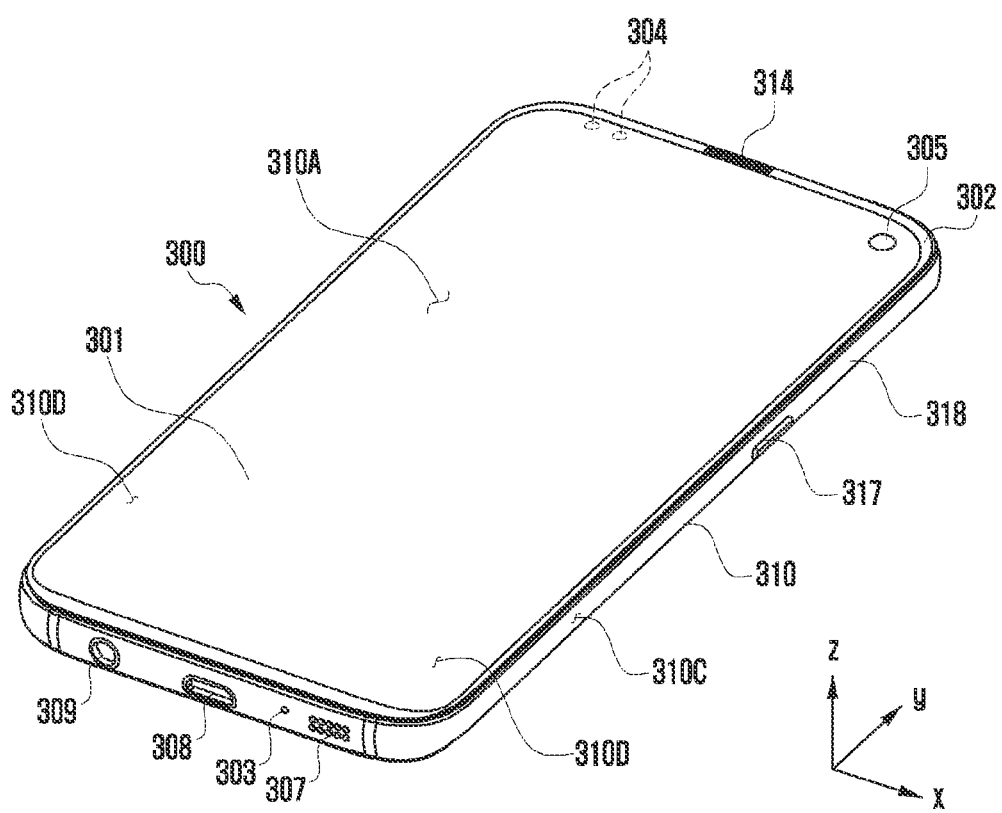
FIG. 3A is a perspective view of a front surface of a mobile electronic device according to an embodiment.

FIG. 3A is a front perspective view illustrating a mobile electronic device 300 according to an embodiment.

Figure 3B:
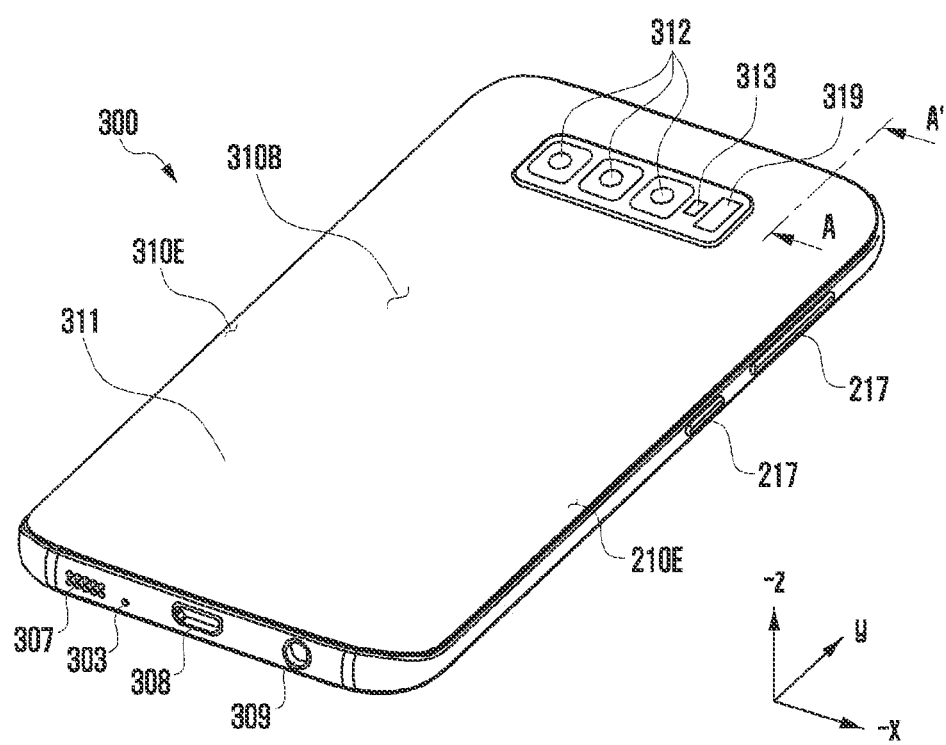
FIG. 3B is a perspective view of a rear surface of the mobile electronic device in FIG. 3A.

FIG. 3B is a rear perspective view illustrating a mobile electronic device 300 according to an embodiment.

Referring to FIGS. 3A and 3B, the mobile electronic device 300 (e.g., the electronic device 101 of FIG. 1) according to various embodiments may include a housing 310 including a first surface (or front surface) 310A, a second surface (or rear surface) 310B, and a side surface 310C enclosing a space between the first surface 310A and the second surface 310B. In one embodiment, the housing may refer to a structure forming some of the first surface 310A, the second surface 310B, and the side surface 310C. According to one embodiment, the first surface 310A may be formed by an at least partially substantially transparent front plate 302 (e.g., a polymer plate or a glass plate including various coating layers). The second surface 310B may be formed by a substantially opaque rear plate 311. The rear plate 311 may be formed by, for example, coated or colored glass, ceramic, polymer, metal (e.g., aluminum, stainless steel (STS or SUS), or magnesium), or a combination of at least two of the above materials. The side surface 310C may be coupled to the front plate 302 and the rear plate 311 and be formed by a side bezel structure (or "side member") 318 including a metal and/or a polymer. In some embodiments, the rear plate 311 and the side bezel structure 318 may be integrally formed and include the same material (e.g., metal material such as aluminum).

In the illustrated embodiment, the front plate 302 may include two first regions 310D bent and extended seamlessly from the first surface 310A toward the rear plate 311 at both ends of a long edge of the front plate 302. In the illustrated embodiment (see FIG. 3B), the rear plate 311 may include two second regions 310E bent and extended seamlessly from the second surface 310B towards the front plate 302 at both ends of a long edge. In some embodiments, the front plate 302 (or the rear plate 311) may include only one of the first regions 310D (or the second regions 310E). In one embodiment, a portion of the first regions 310D or the second regions 310E may not be included. In the above embodiments, when viewed from the side surface of the mobile electronic device 300, the side bezel structure 318 may have a first thickness (or width) at a side surface in which the first region 310D or the second region 310E is not included and have a second thickness smaller than the first thickness at a side surface including the first region 310D or the second region 310E.

According to one embodiment, the mobile electronic device 300 may include at least one of a display 301; audio modules 303, 307, and 314; sensor modules 304, 316, and 319; camera modules 305, 312, and 313; key input device 317; light emitting element 306; and connector holes 308 and 309. In some embodiments, the mobile electronic device 300 may omit at least one (e.g., the key input device 317 or the light emitting element 306) of the components or may further include other components.

The display 301 may be exposed through, for example, a substantial portion of the front plate 302. In some embodiments, at least part of the display 301 may be exposed through the front plate 302 forming the first region 310D of the side surface 310C and the first surface 310A. In some embodiments, an edge of the display 301 may be formed to be substantially the same as an adjacent outer edge shape of the front plate 302. In one embodiment, in order to enlarge an area where the display 301 is exposed, a distance between an outer edge of the display 301 and an outer edge of the front plate 302 may be formed to be substantially the same.

In an embodiment, in a portion of a screen display area of the display 301, a recess or an opening may be formed, and at least one of the audio module 314 and the sensor module 304, the camera module 305, and the light emitting element 306 aligned with the recess or the opening may be included. In one embodiment, at a rear surface of a screen display area of the display 301, at least one of the audio module 314, the sensor module 304, the camera module 305, the fingerprint sensor module 316, and the light emitting element 306 may be included. In one embodiment, the display 301 may be coupled to or disposed adjacent to a touch detection circuit, a pressure sensor capable of measuring intensity (pressure) of the touch, and/or a digitizer for detecting a stylus pen of a magnetic field method. In some embodiments, at least part of the sensor modules 304 and 319 and/or at least part of the key input device 317 may be disposed in a first region 310D and/or a second region 310E.

The audio modules 303, 307, and 314 may include a microphone hole 303 and speaker holes 307 and 314. The microphone hole 303 may dispose a microphone for obtaining an external sound therein; and, in some embodiments, a plurality of microphones may be disposed to detect a direction of a sound. The speaker holes 307 and 314 may include an external speaker hole 307 and a call receiver hole 314. In some embodiments, the speaker holes 307 and 314 and the microphone hole 303 may be implemented into one hole, or the speaker may be included without the speaker holes 307 and 314 (e.g., piezo speaker).

The sensor modules 304, 316, and 319 may generate an electrical signal or a data value corresponding to an operating state inside the mobile electronic device 300 or an environment state outside the mobile electronic device 300. The sensor modules 304, 316, and 319 may include, for example, a first sensor module 304 (e.g., proximity sensor) and/or a second sensor module (e.g., fingerprint sensor), disposed at the first surface 310A of the housing 310, and/or a third sensor module 319 (e.g., a heart rate monitor (HRM) sensor) and/or a fourth sensor module 316 (e.g., fingerprint sensor), disposed at the second surface 310B of the housing 310. The fingerprint sensor may be disposed at the second surface 310B as well as the first surface 310A (e.g., the display 301) of the housing 310. The mobile electronic device 300 may further include a sensor module, for example, at least one of a gesture sensor, gyro sensor, air pressure sensor, magnetic sensor, acceleration sensor, grip sensor, color sensor, IR sensor, biometric sensor, temperature sensor, humidity sensor, and illumination sensor 304.

The camera modules 305, 312, and 313 may include a first camera device 305 disposed at the first surface 310A of the mobile electronic device 300, a second camera device 312 disposed at the second surface 310B thereof, and/or a flash 313. The camera modules 305 and 312 may include one or a plurality of lenses, an image sensor, and/or an ISP. The flash 313 may include, for example, a light emitting diode or a xenon lamp. In some embodiments, two or more lenses (infrared camera, wide angle and telephoto lens) and image sensors may be disposed at one surface of the mobile electronic device 300.

The key input device 317 may be disposed at the side surface 310C of the housing 310. In one embodiment, the mobile electronic device 300 may not include some or all of the above-described key input devices 317, and the key input device 317 that is not included may be implemented in other forms such as a soft key on the display 301. In some embodiments, the key input device 317 may include a sensor module 316 disposed at the second surface 310B of the housing 310.

The light emitting element 306 may be disposed at, for example, the first surface 310A of the housing 310. The light emitting element 306 may provide, for example, status information of the mobile electronic device 300 in an optical form. In one embodiment, the light emitting element 306 may provide, for example, a light source interworking with an operation of the camera module 305. The light emitting element 306 may include, for example, a light emitting diode (LED), an IR LED, and a xenon lamp.

The connector ports 308 and 309 may include a first connector port 308 that may receive a connector (e.g., a USB connector) for transmitting and receiving power and/or data to and from an external electronic device and/or a second connector hole (e.g., earphone jack) 309 that can receive a connector for transmitting and receiving audio signals to and from an external electronic device.

Figure 3C:
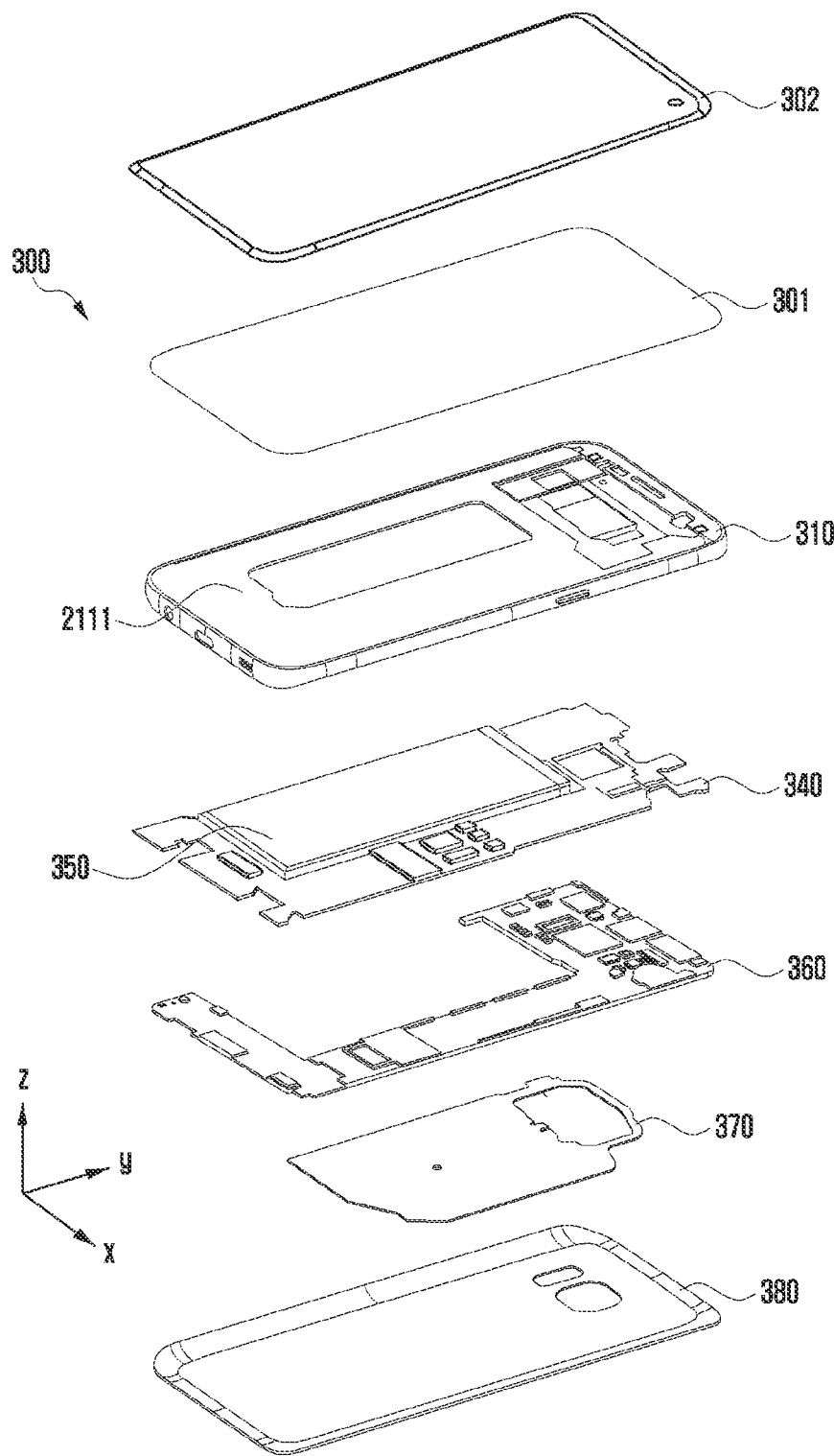
FIG. 3C is an exploded perspective view of the mobile electronic device in FIGS. 3A and 3B.

FIG. 3C is an exploded perspective view illustrating a mobile electronic device according to an embodiment.

Referring to FIG. 3C, the mobile electronic device 320 (e.g., the mobile electronic device 300 of FIG. 3A) may include a side bezel structure 321, first support member 3211 (e.g., bracket), front plate 322, display 323, printed circuit board 324, battery 325, second support member 326 (e.g., rear case), antenna 327, and rear plate 328. In some embodiments, the electronic device 320 may omit at least one (e.g., the first support member 3211 or the second support member 326) of the components or may further include other components. At least one of the components of the electronic device 320 may be the same as or similar to at least one of the components of the mobile electronic device 300 of FIG. 3A or 3B and a duplicated description is omitted below.

The first support member 3211 may be disposed inside the electronic device 320 to be connected to the side bezel structure 321 or may be integrally formed with the side bezel structure 321. The first support member 3211 may be made of, for example, a metal material and/or a non-metal (e.g., polymer) material. In the first support member 3211, the display 323 may be coupled to one surface thereof, and the printed circuit board 324 may be coupled to the other surface thereof. In the printed circuit board 324, a processor, a memory, and/or an interface may be mounted. The processor may include, for example, one or more of a CPU, AP, GPU, ISP, sensor hub processor, or CP.

The memory may include, for example, a volatile memory or a nonvolatile memory.

The interface may include, for example, a HDMI, USB interface, SD card interface, and/or audio interface. The interface may, for example, electrically or physically connect the electronic device 320 to an external electronic device and include a USB connector, an SD card/multimedia card (MMC) connector, or an audio connector.

The battery 325 is a device for supplying power to at least one component of the electronic device 320 and may include, for example, a non-rechargeable primary battery, a rechargeable secondary battery, or a fuel cell. At least part of the battery 325 may be disposed, for example, on substantially the same plane as that of the printed circuit board 324. The battery 325 may be integrally disposed inside the electronic device 320 or may be detachably disposed in the electronic device 320.

The antenna 327 may be disposed between the rear plate 328 and the battery 325. The antenna 327 may include, for example, a near field communication (NFC) antenna, wireless charging antenna, and/or magnetic secure transmission (MST) antenna. The antenna 327 may perform, for example, short range communication with an external device or may wirelessly transmit and receive power required for charging. In one embodiment, an antenna structure may be formed by some or a combination of the side bezel structure 321 and/or the first support member 3211.

Figure 4A:
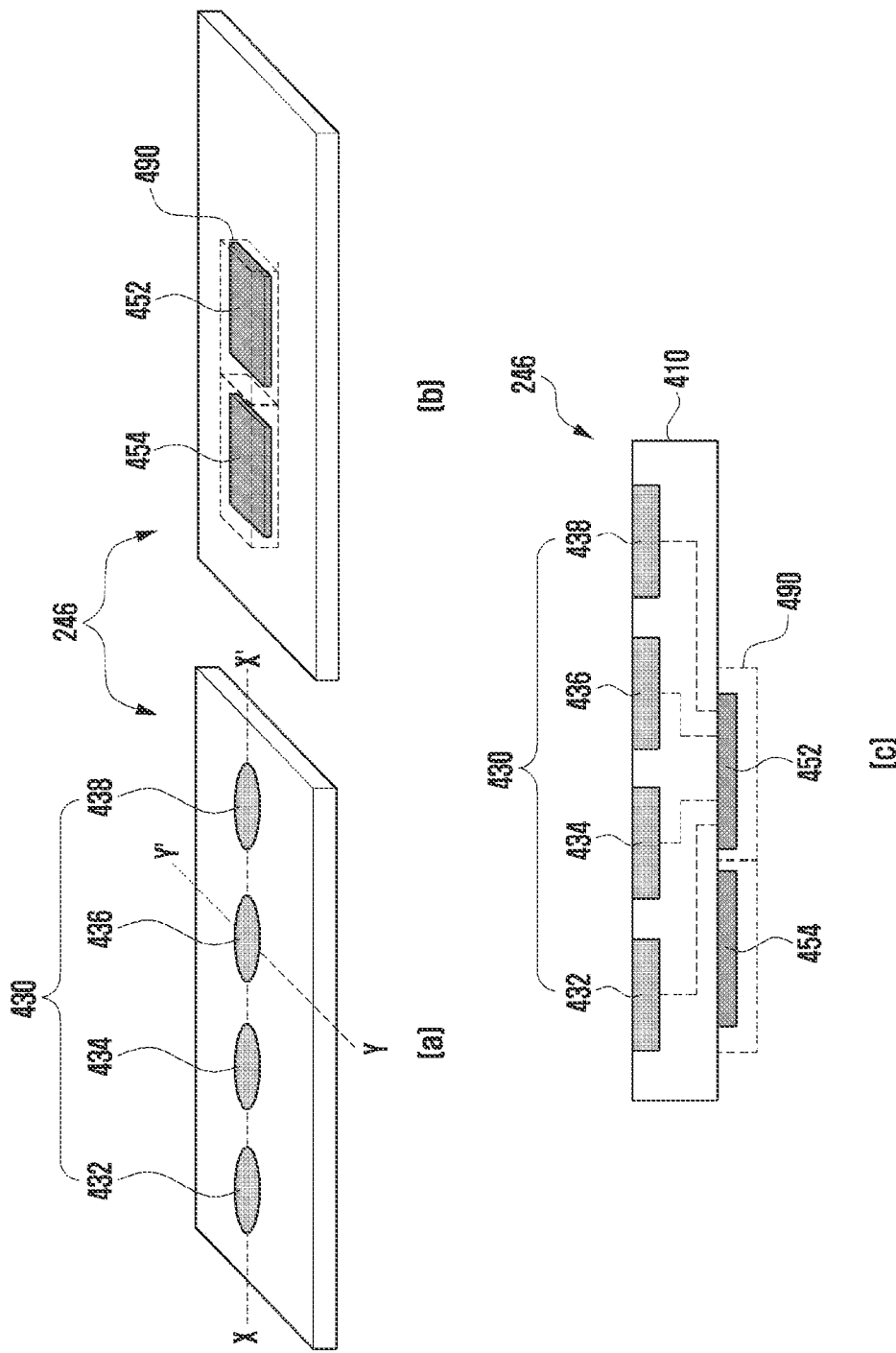
FIG. 4A are illustrations of a structure of a third antenna module in FIG. 2.

FIG. 4A is a diagram illustrating a structure of, for example, a third antenna module described with reference to FIG. 2 according to an embodiment.

Referring to FIG. 4A(a) is a perspective view illustrating the third antenna module 246 viewed from one side, and FIG. 4A(b) is a perspective view illustrating the third antenna module 246 viewed from the other side. FIG. 4A(c) is a cross-sectional view illustrating the third antenna module 246 taken along line X-X' of FIG. 4A.

With reference to FIG. 4A, in one embodiment, the third antenna module 246 may include a printed circuit board 410, an antenna array 430, a RFIC 452, and a PMIC 454. Alternatively, the third antenna module 246 may further include a shield member 490. In other embodiments, at least one of the above-described components may be omitted or at least two of the components may be integrally formed.

The printed circuit board 410 may include a plurality of conductive layers and a plurality of non-conductive layers stacked alternately with the conductive layers. The printed circuit board 410 may provide electrical connections between the printed circuit board 410 and/or various electronic components disposed outside using wirings and conductive vias formed in the conductive layer.

The antenna array 430 (e.g., 248 of FIG. 2) may include a plurality of antenna elements 432, 434, 436, or 438 disposed to form a directional beam. As illustrated, the antenna elements 432, 434, 436, or 438 may be formed at a first surface of the printed circuit board 410. According to another embodiment, the antenna array 430 may be formed inside the printed circuit board 410. According to the embodiment, the antenna array 430 may include the same or a different shape or kind of a plurality of antenna arrays (e.g., dipole antenna array and/or patch antenna array).

The RFIC 452 (e.g., the third RFIC 226 of FIG. 2) may be disposed at another area (e.g., a second surface opposite to the first surface) of the printed circuit board 410 spaced apart from the antenna array. The RFIC 452 is configured to process signals of a selected frequency band transmitted/received through the antenna array 430. According to one embodiment, upon transmission, the RFIC 452 may convert a baseband signal obtained from a CP to an RF signal of a designated band. Upon reception, the RFIC 452 may convert an RF signal received through the antenna array 430 to a baseband signal and transfer the baseband signal to the CP.

According to another embodiment, upon transmission, the RFIC 452 may up-convert an IF signal (e.g., about 9 GHz to about 11 GHz) obtained from an intermediate frequency integrated circuit (IFIC) (e.g., 228 of FIG. 2) to an RF signal of a selected band. Upon reception, the RFIC 452 may down-convert the RF signal obtained through the antenna array 430, convert the RF signal to an IF signal, and transfer the IF signal to the IFIC.

The PMIC 454 may be disposed in another partial area (e.g., the second surface) of the printed circuit board 410 spaced apart from the antenna array 430. The PMIC 454 may receive a voltage from a main PCB to provide power necessary for various components (e.g., the RFIC 452) on the antenna module.

The shielding member 490 may be disposed at a portion (e.g., the second surface) of the printed circuit board 410 so as to electromagnetically shield at least one of the RFIC 452 or the PMIC 454. According to one embodiment, the shield member 490 may include a shield can.

In various embodiments, the third antenna module 246 may be electrically connected to another printed circuit board (e.g., main circuit board) through a module interface. The module interface may include a connecting member, for example, a coaxial cable connector, board to board connector, interposer, or flexible printed circuit board (FPCB). The RFIC 452 and/or the PMIC 454 of the antenna module may be electrically connected to the printed circuit board through the connection member.

Figure 4B:
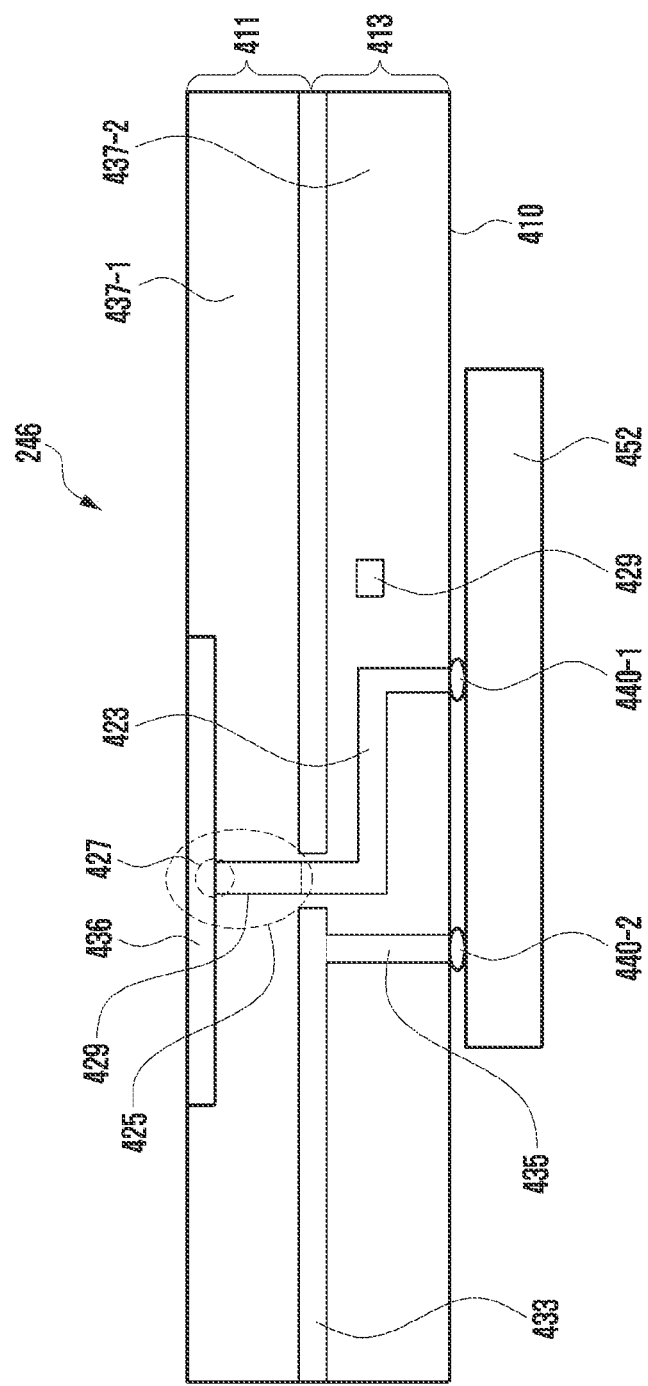
FIG. 4B is a cross-sectional view taken along a line Y-Y' in FIG. 4A.

FIG. 4B is a cross-sectional view illustrating the third antenna module 246 taken along line Y-Y' of FIG. 4A(a) according to various embodiments of the disclosure. The printed circuit board 410 of the illustrated embodiment may include an antenna layer 411 and a network layer 413

With reference to FIG. 4B, the antenna layer 411 may include at least one dielectric layer 437-1, and an antenna element 436 and/or a power feeding portion 425 formed on or inside an outer surface of a dielectric layer. The power feeding portion 425 may include a power feeding point 427 and/or a power feeding line 429.

The network layer 413 may include at least one dielectric layer 437-2, at least one ground layer 433, at least one conductive via 435, a transmission line 423, and/or a power feeding line 429 formed on or inside an outer surface of the dielectric layer.

Further, in the illustrated embodiment, the RFIC 452 (e.g., the third RFIC 226 of FIG. 2) of FIG. 4A(c) may be electrically connected to the network layer 413 through, for example, first and second solder bumps 440-1 and 440-2. In other embodiments, various connection structures (e.g., solder or ball grid array (BGA)) instead of the solder bumps may be used. The RFIC 452 may be electrically connected to the antenna element 436 through the first solder bump 440-1, the transmission line 423, and the power feeding portion 425. The RFIC 452 may also be electrically connected to the ground layer 433 through the second solder bump 440-2 and the conductive via 435. The RFIC 452 may also be electrically connected to the above-described module interface through the power feeding line 429.

Figure 5A:
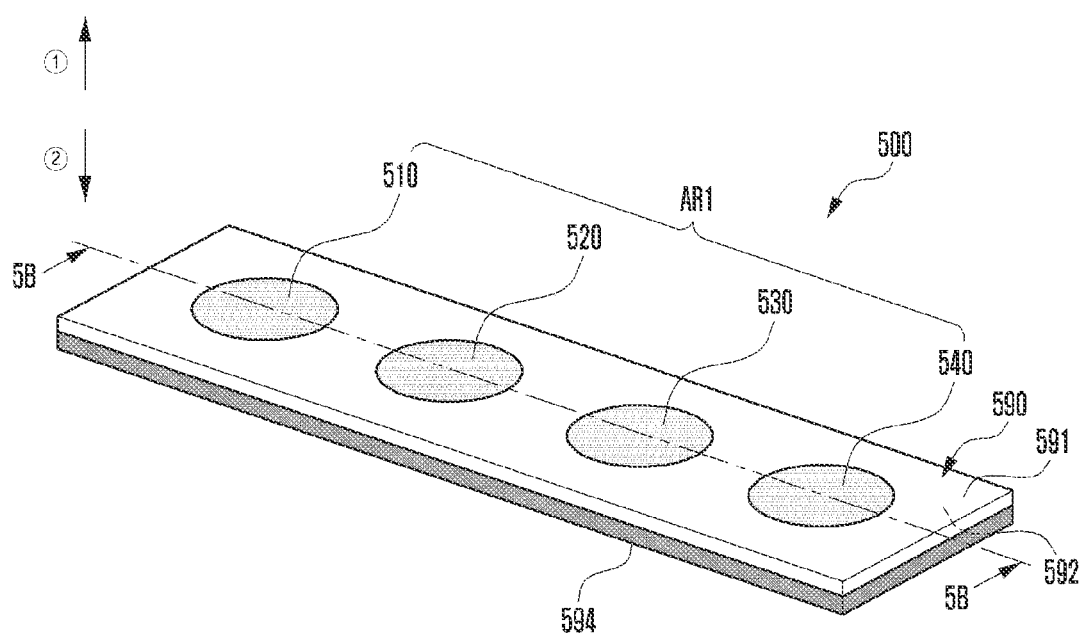
FIG. 5A is a perspective view of an antenna module according to an embodiment.
Figure 5B:
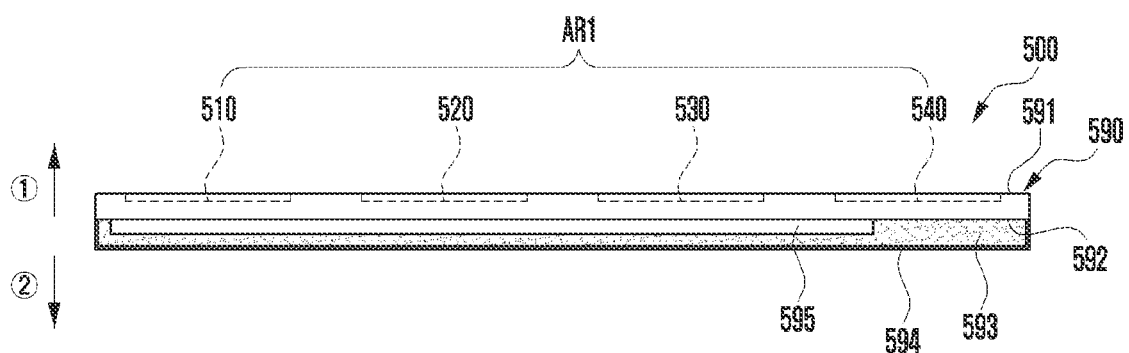
FIG. 5B is a cross-sectional view taken along a line 5B-5B in FIG. 5A.

FIG. 5A is a perspective view of an antenna module 500 according to an embodiment. FIG. 5B is a cross-sectional view taken along the line B-B' in FIG. 5A Referring to FIGS. 5A and 5B, the antenna module 500 may be similar, at least in part, to the third antenna module 246 of FIG. 2, or may include other embodiments of the antenna module 500.

The antenna module 500 may include, as an antenna element, an antenna array AR1 composed of a plurality of conductive patches 510, 520, 530, and 540. The plurality of conductive patches 510, 520, 530, and 540 may be formed on a printed circuit board (PCB) 590. The PCB 590 may have a first surface 591 facing a first direction (indicated by ①) and a second surface 592 facing a second direction (indicated by ②) opposite to the first direction. The antenna module 500 may include a wireless communication circuit 595 disposed on the second surface 592 of the PCB 590. The plurality of conductive patches 510, 520, 530, and 540 may be electrically connected to the wireless communication circuit 595. The wireless communication circuit 595 may be configured to transmit and/or receive a radio frequency signal in the range of about 3 GHz to 100 GHz via the antenna array AR1.

The plurality of conductive patches 510, 520, 530, and 540 may include a first conductive patch 510, a second conductive patch 520, a third conductive patch 530, and a fourth conductive patch 540 which are disposed at regular intervals on the first surface 591 of the PCB 590 or near the first surface 591 in the PCB 590. The conductive patches 510, 520, 530, 540 may have substantially the same configuration. Although the antenna module 500 is illustrated and described as including the antenna array AR1 composed of four conductive patches 510, 520, 530, and 540, this is exemplary only and is not intended to be construed as a limitation. Alternatively, the antenna module 500 may include, as the antenna array AR1, one, two, three, five, or more conductive patches. The antenna module 500 may further include a plurality of conductive patterns (e.g., a dipole antenna) disposed on the PCB 590. In this case, the conductive patterns may be arranged to form a beam pattern direction different from (e.g., perpendicular to) a beam pattern direction of the conductive patches 510, 520, 530, and 540.

The antenna module 500 may include a protective member 593 disposed on the second surface 592 of the PCB 590 to surround at least partially the wireless communication circuit 595. The protective member 593 is an encapsulation layer for covering the wireless communication circuit 595 and may be formed of a dielectric material that is coated and then cured and/or solidified. The protective member 593 may be formed of an epoxy resin. The protective member 593 may be disposed to surround all or part of the wireless communication circuit 595 on the second surface 592 of the PCB 590. The antenna module 500 may include a conductive shielding layer 594 coated on a surface of the protective member 593. The conductive shielding layer 594 may shield noise (e.g., direct current (DC) to DC (DC-DC) noise or an interference frequency component), generated at the antenna module 500, from being spread to the surroundings. The conductive shielding layer 594 may be formed of a conductive material coated on the surface of the protective member 593 by a thin film deposition method such as sputtering. The conductive shielding layer 594 may be electrically connected to a ground of the PCB 590. The protective member 593 and/or the conductive shielding layer 594 may be replaced with a shield can mounted on the PCB 590.

The antenna module 500 operating in a relatively high frequency band may generate noise (e.g., DC-DC noise or an interference frequency component). Such noise may be delivered to a certain structure (e.g., a legacy antenna module or a display) disposed around the antenna module 500, thereby causing performance degradation of the structure. Thus, in addition to the above-described conductive shielding layer 594, an enhanced shielding structure (e.g., an enhanced ground structure) may be further required. Moreover, the antenna module 500, which generates relatively high heat, may also require an improved heat dissipation structure.

An antenna module having an enhanced and improved shielding and heat dissipation structure is described below through various embodiments. In addition, an electronic device including the antenna module 500 is described below.

Figure 6A:
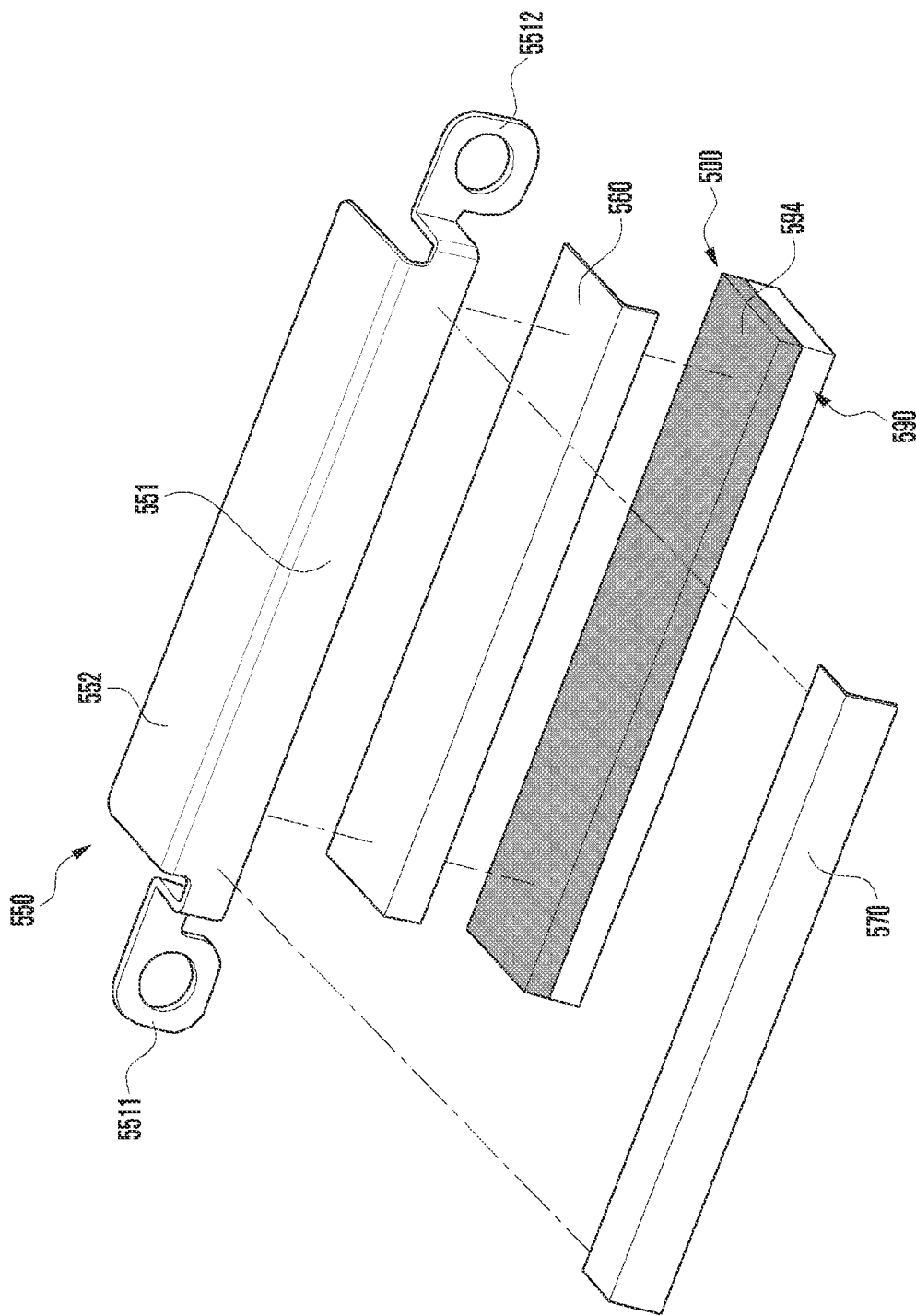
FIG. 6A is an exploded perspective view of an antenna module and a conductive member applied thereto according to an embodiment.
Figure 6B:
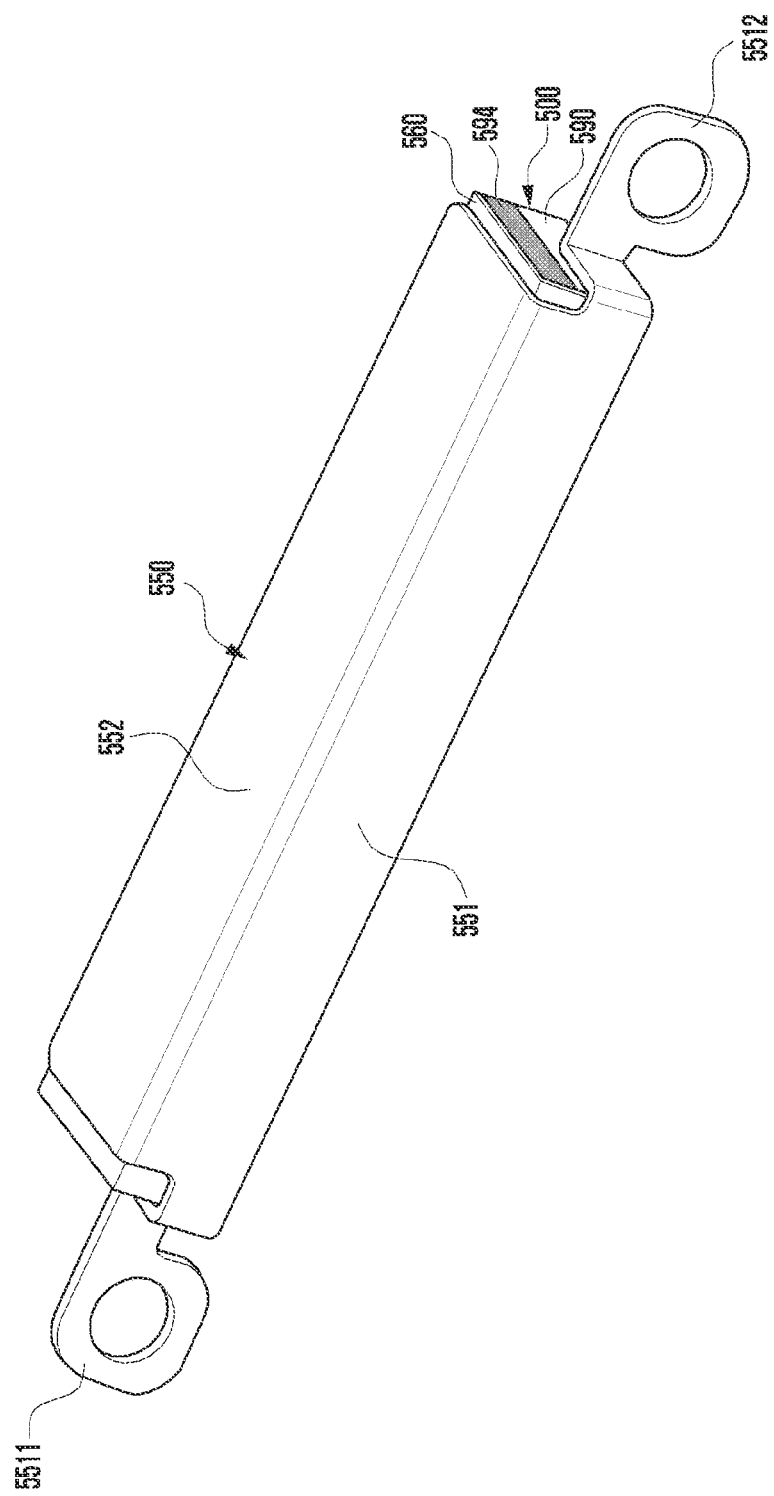
FIG. 6B is a perspective view showing an antenna module and a conductive member applied thereto according to an embodiment.

FIG. 6A is an exploded perspective view of the antenna module 500 and a conductive member 550 applied thereto according to an embodiment. FIG. 6B is a perspective view of the antenna module 500 and the conductive member 550 applied thereto according to an embodiment.

Referring to FIGS. 6A and 6B, an electronic device (e.g., the electronic device 700 in FIG. 7 described below) may include the conductive member 550 fixed, at least in part, to the antenna module 500, and a thermally conductive member 560 disposed between the conductive member 550 and the antenna module 500 to prevent electric shock. The conductive member 550 may be fixed to a conductive portion (e.g., the conductive portion 721 in FIG. 7 described below) of a housing (e.g., the housing 710 in FIG. 7 described below) of the electronic device and/or to a conductive portion of a support member (e.g., the support member 711 in FIG. 7 described below). The conductive member 550 may be in physical contact with a conductive portion of a lateral member (e.g., the lateral member 720 in FIG. 7) to thereby reinforce the rigidity of the antenna module 500. The conductive member 550 may be formed of a metal material such as stainless steel (SUS), copper (Cu), or aluminum (Al) to effectively conduct a high-temperature heat emitted from the antenna module 500 to the outside. The conductive member 550 may be electrically connected to the conductive shielding layer 594 of the antenna module 500, thereby enhancing shielding against noise.

The conductive member 550 may include a first support part 551 facing, at least in part, (e.g., facing the lateral surface of) the PCB 590 of the antenna module 500, and a second support part 552 extended from the first support part 551 and bent to face the conductive shielding layer 594. The conductive member 550 may include at least one extension part 5511 and 5512 extended from at least one end of the first support part 551 and fixed to the conductive portion of the housing and/or to the conductive portion of the support member. The at least one extension part 5511 and 5512 may include a pair extended in opposite directions of the conductive member 550. The at least one extension part 5511 and 5512 may be extended from the second support part 552. Therefore, the antenna module 500 may be supported by the first support part 551 and the second support part 552 of the conductive member 550 and fixed to the conductive portion (of the housing and/or to the described below conductive portion of the support member through the at least one extension part 5511 and 5512 by a fastening member such as a screw.

The conductive member 550 may be attached to the conductive shielding layer 594 of the antenna module 500 through the thermally conductive member 560 for electric shock prevention. The conductive member 550 may be connected to have an alternating current (AC) ground structure having capacitance with the conductive shielding layer 594 of the antenna module 500 through the thermally conductive member 560 for electric shock prevention. This makes it possible to prevent an electric shock issue that may be caused when the conductive member 550 comes in contact with a conductive portion forming, at least in part, the appearance of the electronic device.

The electronic device may further include another thermally conductive member 570 disposed between the conductive member 550 and the conductive portion. The thermally conductive member 570 may be formed of a thermally conductive tape or a thermal interface material (TIM).

Figure 7:
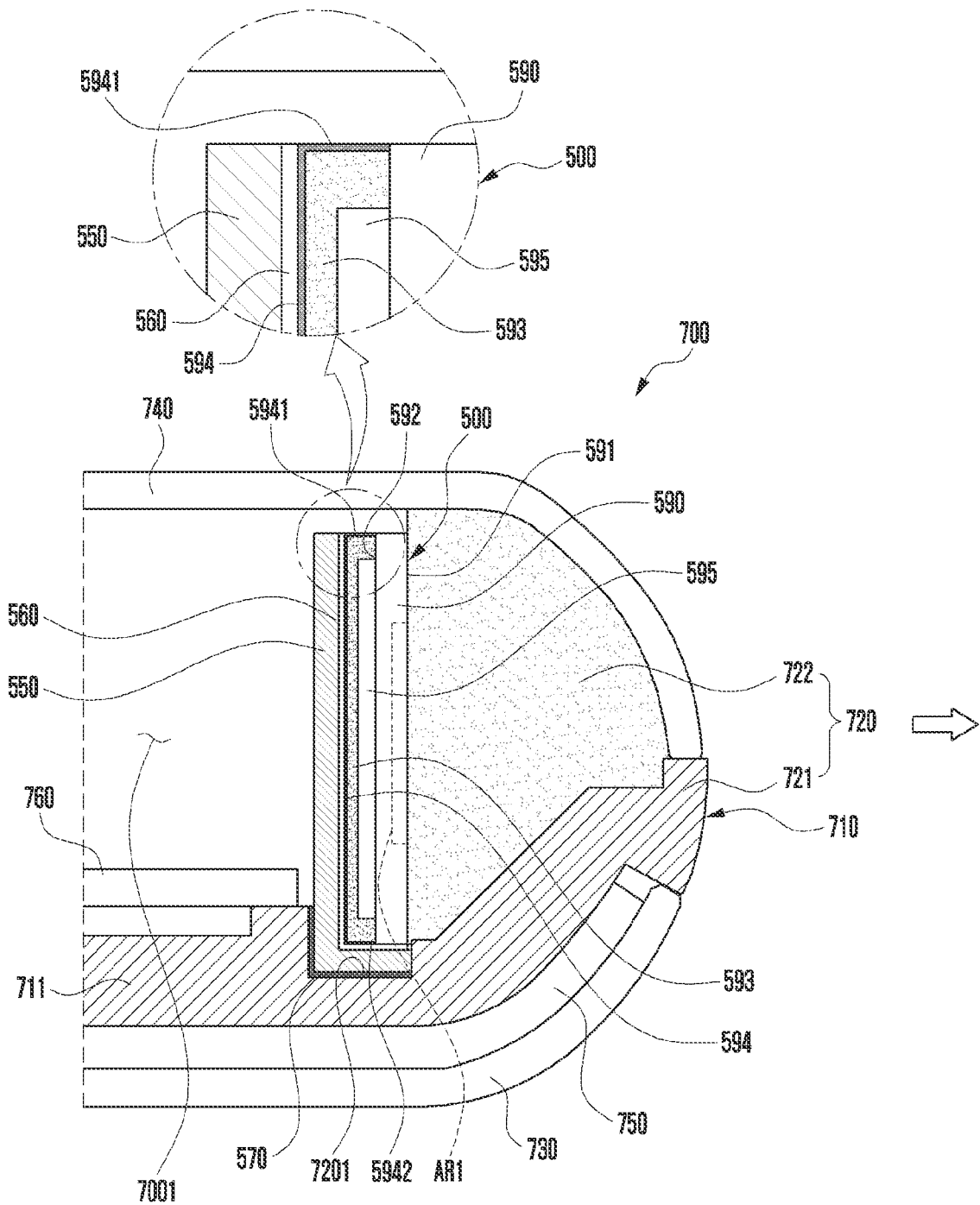
FIG. 7 is a cross-sectional view partially showing an electronic device including an antenna module with a conductive member applied according to an embodiment.

FIG. 7 is a cross-sectional view partially showing the electronic device 700 including the antenna module 500 with the conductive member 560 applied according to an embodiment.

Referring to FIG. 7, the electronic device 700 may be similar, at least in part, to the electronic device 101 of FIG. 1 or the electronic device 300 of FIG. 3A, or may include other embodiments of the electronic device 700.

The electronic device 700 may include the housing 710 that includes a front plate 730 (e.g., a first plate) facing a first direction (e.g., the −Z direction), a rear plate 740 (e.g., a second plate) facing a direction (e.g., the Z direction) opposite to the front plate 730, and the lateral member 720 surrounding an inner space 7001 between the front plate 730 and the rear plate 740. The lateral member 720 may include the conductive portion 721 disposed at least in part and a polymer portion 722 (i.e., a non-conductive portion) insert-injected into the conductive portion 721. The polymer portion 722 may be replaced with a space or any other dielectric material. The polymer portion 722 may be structurally combined with the conductive portion 721. The lateral member 720 may include the support member 711 extended partially into the inner space 7001. The support member 711 may be extended from the lateral member 720 into the inner space 7001 or formed by a structural combination with the lateral member 720. The support member 711 may be extended from the conductive portion 721. The support member 711 may support at least a portion of the antenna module 500 disposed in the inner space 7001. The support member 711 may be disposed to support at least a portion of a display 750. The display 750 may be disposed to be visible from the outside through at least a portion of the front plate 730.

The antenna module 500 may be disposed in a direction perpendicular to the front plate 730 in the inner space 7001 of the electronic device 700. The antenna module 500 may be mounted such that the antenna array AR1 including the conductive patches 510, 520, 530, and 540 faces the lateral member 720. For example, the antenna module 500 may be mounted into a module mounting portion 7201 provided in the lateral member 720 such that the first surface 591 of the PCB 590 faces the lateral member 720. At least a portion of the lateral member 720 facing the antenna module 500 may be formed as the polymer portion 722 such that a beam pattern is formed in a direction (denoted by an arrow in FIG. 7) of the lateral member 720. The electronic device 700 may include a device substrate 760 (e.g., a main substrate) disposed in the inner space 7001. The antenna module 500 may be electrically connected to the device substrate 760 through an electrical connection member (e.g., an FPCB connector).

The electronic device 700 may include the conductive member 550 disposed on at least a portion of the antenna module 500. The conductive member 550 may be formed in various shapes depending on a shape of the antenna module 500 or a mounting structure of the antenna module 500 on the lateral member 720. At least a portion of the conductive member 550 may be disposed to face, at least in part, the conductive shielding layer 594 formed in a direction of the second surface 592 of the PCB 590. At least a portion of the conductive member 550 may be disposed to face the conductive portion 721 of the lateral member 720. For example, at least a portion of the conductive member 550 may be disposed to face the conductive portion 721 in the module mounting portion 7201. According to an embodiment, the conductive shielding layer 594 may include a first ending portion 5941 and a second ending portion 5942. The first ending portion 5941 and the second ending portion 5942 may be extended to contact the second surface 592 in a direction (denoted by an arrow in FIG. 7) where the lateral member 720 faces.

The electronic device 700 may include the thermally conductive member 560 for electric shock prevention interposed between the conductive member 550 and the conductive shielding layer 594. The thermally conductive member 560 for electric shock prevention may have a tape form. The thermally conductive member 560 for electric shock prevention may connect the conductive member 550 and the conductive shielding layer 594 of the antenna module 500 to have an AC ground structure having capacitance, thereby preventing electric shock caused by a physical contact between the conductive member 550 and the conductive portion 721. The thermally conductive member 560 for electric shock prevention may not only connect the conductive member 550 and the conductive shielding layer 594 to have an AC ground structure, but also deliver a high-temperature heat generated from the antenna module 500 to the conductive member 550 by including a thermally conductive material. The electronic device 700 may also include another thermally conductive member 570 disposed between the conductive member 550 and the conductive portion 721 of the lateral member 720. The thermally conductive member 570 may be formed of a thermally conductive tape or a TIM, and may induce an effective heat dissipation by delivering a heat, transferred from the antenna module 500 to the conductive member 550, to the conductive portion 721 of the lateral member 720 and/or the support member 711.

The conductive member 550 may not only effectively shield a noise generated from the antenna module 500, but also deliver a high-temperature heat generated from the antenna module 500 to a surrounding conductive structure (e.g., the conductive portion 721 or the conductive support member 711). In some embodiments, the conductive member 550 may be replaced with a conductive structure which extends from the conductive portion 721 and formed of a structure for supporting the antenna module.

Figure 8:
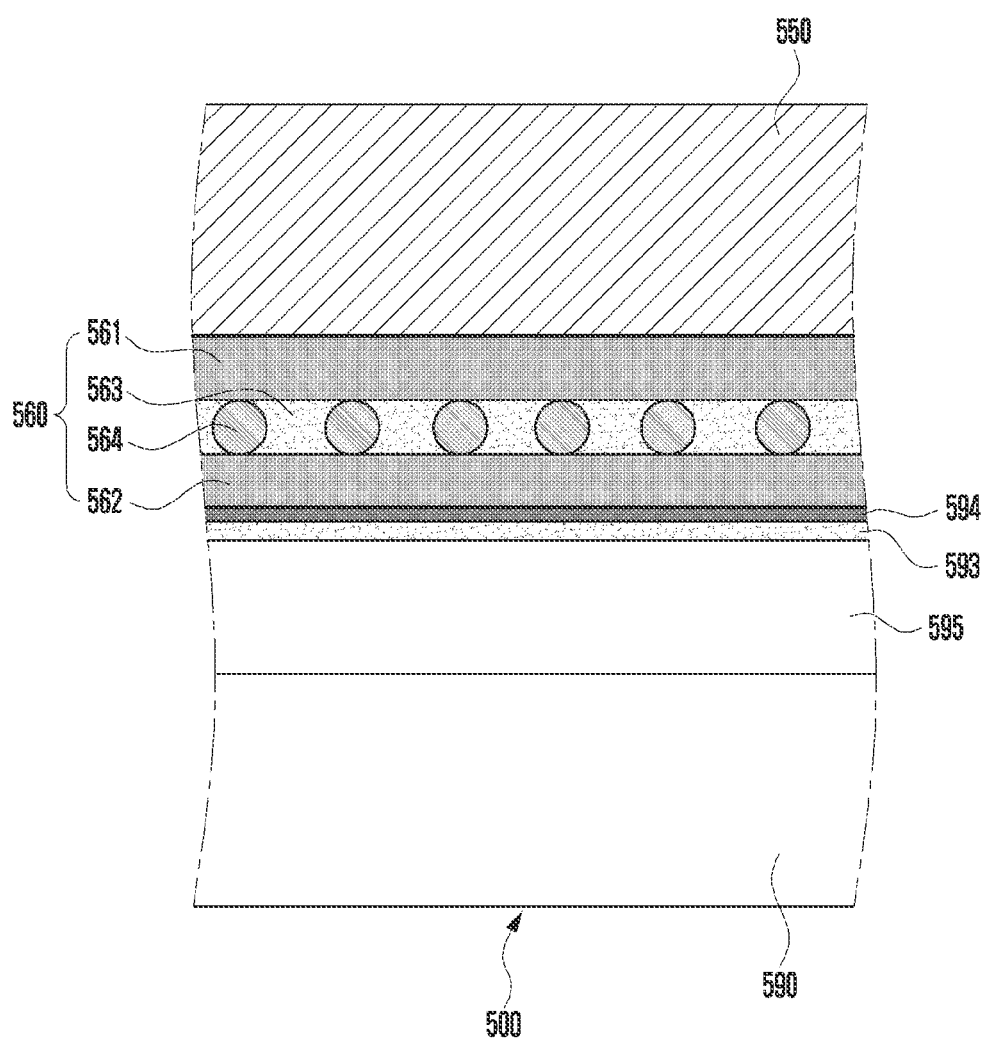
FIG. 8 is a cross-sectional view partially showing a thermally conductive member for electric shock prevention shown in FIG. 7.

FIG. 8 is a cross-sectional view partially showing the thermally conductive member 560 for electric shock prevention shown in FIG. 7.

Referring to FIG. 8, the thermally conductive member 560 for electric shock prevention may include a first layer 561 facing the conductive member 550, a second layer 562 facing the conductive shielding layer 594 of the antenna module 500, and a third layer 563 interposed between the first layer 561 and the second layer 562 and containing a plurality of ceramic fillers 564. Each of the first layer 561 and the second layer 562 may be formed of an anisotropic conductive film (ACF) configured to have conductivity in one direction in response to a pressure. The third layer 563 may be formed of a dielectric material such as an epoxy resin. The ceramic filler 564 may be formed in a ball shape having a high dielectric constant and a high thermal conductivity. The ceramic filler 564 may be formed in various shapes.

The first layer 561 and the second layer 562 may have a specific capacitance (e.g., about 40 pF to about 60 pF) through the third layer 563. When the conductive member 550 is attached to the conductive shielding layer 594 of the antenna module 500 through the thermally conductive member 560 for electric shock prevention, the first layer 561 and the second layer 562 may be converted into a conductor by a certain pressure (e.g., a pressure for attachment), and the thermally conductive member 560 for electric shock prevention may have an AC ground structure having a specific capacitance value through the third layer 563. For example, the thermally conductive member 560 for electric shock prevention, together with the conductive shielding layer 594, may exhibit an improved effect of shielding noise generated from the antenna module 500, and also prevent an electric shock that can be generated through the conductive portion of the housing 710. The thermally conductive member 560 for electric shock prevention may transfer a heat emitted from the antenna module 500 to the conductive member through the ceramic filler 564 filled in the third layer 563.

FIGS. 9 to 13 are cross-sectional views each partially showing electronic devices 900, 1000, 1100, 1200, and 1300, respectively, including the antenna module 500 with a conductive member applied according to an embodiment.

Referring to FIGS. 9 to 13, each of electronic devices 900, 1000, 1100, 1200, and 1300 may be similar, at least in part, to the electronic device 101 of FIG. 1 or the electronic device 300 of FIG. 3A, or may include other embodiments of the electronic device.

In describing the electronic devices of the disclosure, the same components as those of the electronic device 700 shown in FIG. 7 are denoted by the same reference numerals, and, thus, detailed descriptions thereof are omitted here.

Figure 9:
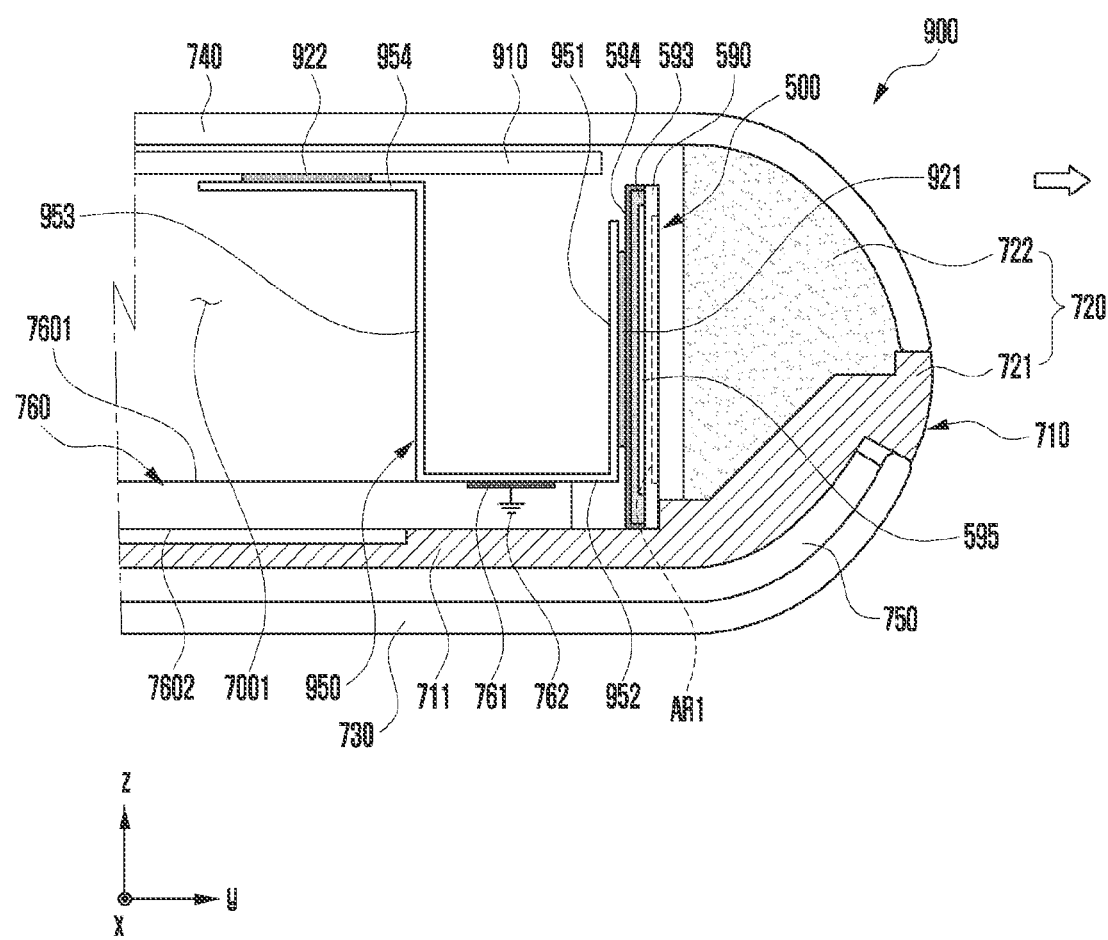
FIGS. 9, 10, 11, 12, and 13 are cross-sectional views each partially showing an electronic device including an antenna module with a conductive member applied according to an embodiment.

Referring to FIG. 9, the electronic device 900 may include a conductive member 950 that is attached to the conductive shielding layer 594 of the antenna module 500 and is physically and electrically connected to the ground layer 762 of the device substrate 760 and to a separate vapor chamber 910 disposed in the inner space 7001 of the electronic device 900. The conductive member 950 may be disposed in the inner space 7001 of the electronic device 900 and formed of at least one of Cu, Al, or SUS in a plate type.

The device substrate 760 may include a first substrate surface 7601 facing the rear plate 740 and a second substrate surface 7602 facing in a direction opposite to the first substrate surface 7601. The device substrate 760 may be disposed substantially parallel with the rear plate 740. The device substrate 760 may be disposed in various ways of not being parallel with the rear plate 740 in view of mounting efficiency. The conductive member 950 may include a first portion 951 connected to the conductive shielding layer 594 of the antenna module 500 through a first thermally conductive member 921, a second portion 952 extended from the first portion 951 and being in contact with the ground pad 761 electrically connected to the ground layer 762 of the device substrate 760 and exposed to the first substrate surface 7601, a third portion 953 extended from the second portion 952 toward the vapor chamber 910, and/or a fourth portion 954 extended from the third portion 953 and connected to the vapor chamber 910 through a second thermally conductive member 922. Although each of the second portion 952, the third portion 953, and the fourth portion 954 sequentially extended from the first portion 951 of the conductive member 950 is shown in a shape of being bent at a right angle, this is exemplary only. Alternatively, at least one of the second portion 952, the third portion 953, and the fourth portion 954 may be bent at various angles rather than at a right angle or bent to have a curved shape. The second portion 952 may be electrically connected to the ground pad 761 of the device substrate 760 through at least one of a screw, soldering, conductive bonding, a conductive tape, a conductive sponge, or a conductive clip. Each of the first thermally conductive member 921 and the second thermally conductive member 922 may be formed of at least one of a conductive tape, a conductive TIM, or a conductive sponge having excellent thermal conductivity.

The noise emitted from the antenna module 500 may be shielded by a ground structure extended through the first portion 951 and the second portion 952 of the conductive member 950 electrically connected from the conductive shielding layer 594 to the ground layer 762 of the device substrate 760. High-temperature heat emitted from the antenna module 500 may be dissipated to both the ground layer 762 of the device substrate 760 and the vapor chamber 910 through the first portion 951, the second portion 952, the third portion 953, and the fourth portion 954 of the conductive member 950.

Figure 10:
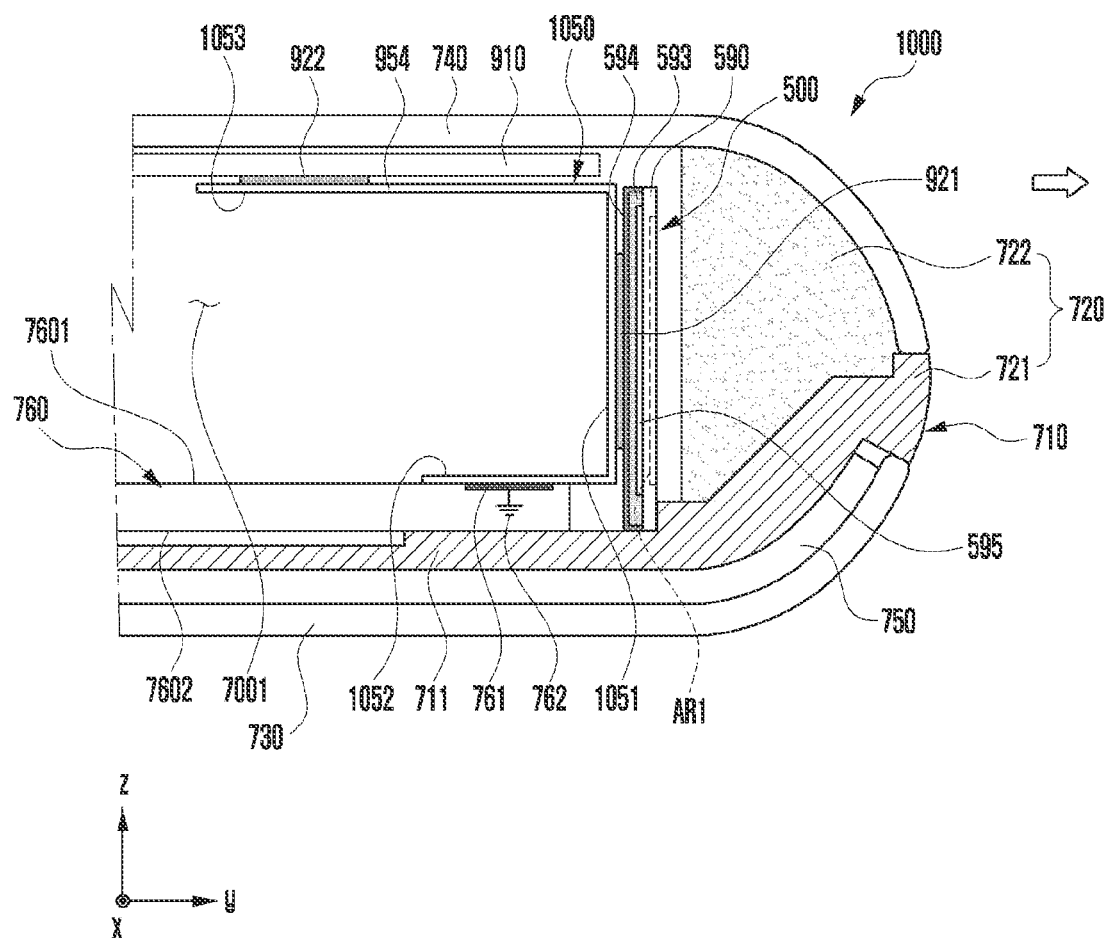

Referring to FIG. 10, the electronic device 1000 may include a plate-type conductive member 1050 that is attached to the conductive shielding layer 594 of the antenna module 500 and is physically and electrically connected to the ground layer 762 of the device substrate 760 and to the vapor chamber 910 disposed in the inner space 7001 of the electronic device 900. The conductive member 1050 may include a first portion 1051 connected to the conductive shielding layer 594 of the antenna module 500 through the first thermally conductive member 921, a second portion 1052 extended from one end of the first portion 1051 and being in contact with the ground pad 761 electrically connected to the ground layer 762 of the device substrate 760 and exposed to the first substrate surface 7601, and a third portion 1053 extended from the other end of the first portion 1051 and connected to the vapor chamber 910 through the second thermally conductive member 922. The second portion 1052 may be electrically connected to the ground pad 761 of the device substrate 760 through at least one of a screw, soldering, conductive bonding, a conductive tape, a conductive sponge, or a conductive clip. Each of the first thermally conductive member 921 and the second thermally conductive member 922 may be formed of at least one of a conductive tape, a conductive TIM, or a conductive sponge having excellent thermal conductivity.

Noise emitted from the antenna module 500 may be shielded by a ground structure extended through the first portion 1051 and the second portion 1052 of the conductive member 1050 electrically connected from the conductive shielding layer 594 to the ground layer 762 of the device substrate 760. High-temperature heat emitted from the antenna module 500 may be dissipated to both the ground layer 762 of the device substrate 760 and the vapor chamber 910 through the first portion 1051, the second portion 1052, and the third portion 1053 of the conductive member 1050.

Figure 11:
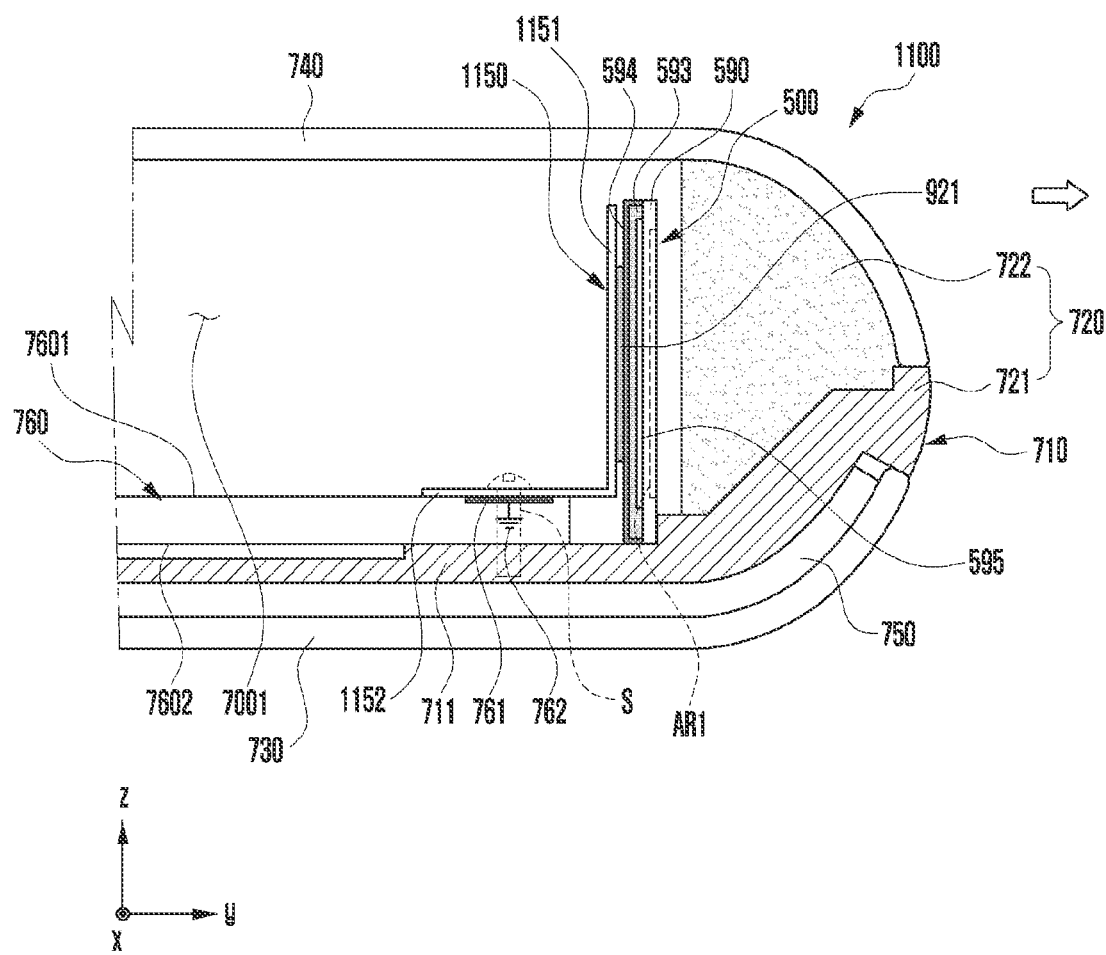

FIG. 11 is an illustration in which, without a separate vapor chamber, the ground layer 762 of the device substrate 760 is used as both a ground structure for noise shielding and a heat dissipation structure.

Referring to FIG. 11, the electronic device 1100 may include a plate-type conductive member 1150 that is attached to the conductive shielding layer 594 of the antenna module 500 and is electrically connected to the ground layer 762 of the device substrate 760. The conductive member 1150 may include a first portion 1151 connected to the conductive shielding layer 594 of the antenna module 500 through the first thermally conductive member 921, and a second portion 1152 extended from the first portion 1151 and electrically connected to the ground layer 762 of the device substrate 760. The second portion 1152 may be in contact with the ground pad 761 exposed to the first substrate surface 7601 of the device substrate 760. The second portion 1152 may be fixed to the device substrate 760 through a screw S. The second portion 1152 may be in contact with the ground pad 761 of the device surface 760 through a conductive tape, soldering, a conductive sponge, a conductive TIM, or a conductive clip. The screw S may penetrate the second portion 1152 of the conductive member 1150 and the device substrate 760 and then be fastened to the support member 711, thus, simultaneously fixing the second portion 1152 and the device substrate 760 in the inner space 7001 of the electronic device 1100. When the support member 711 is formed of a conductive material, an insulating material (e.g., an insulating bushing and/or an insulating washer) may be further interposed between the screw S and the support member 711.

Noise emitted from the antenna module 500 may be shielded by a ground structure extended through the first portion 1151 and the second 1152 of the conductive member 1150 electrically connected from the conductive shielding layer 594 to the ground layer 762 of the device substrate 760. In addition, the high-temperature heat emitted from the antenna module 500 may be dissipated to the ground layer 762, formed in a relatively large area of the device substrate 760, through the conductive member 1150.

Figure 12:
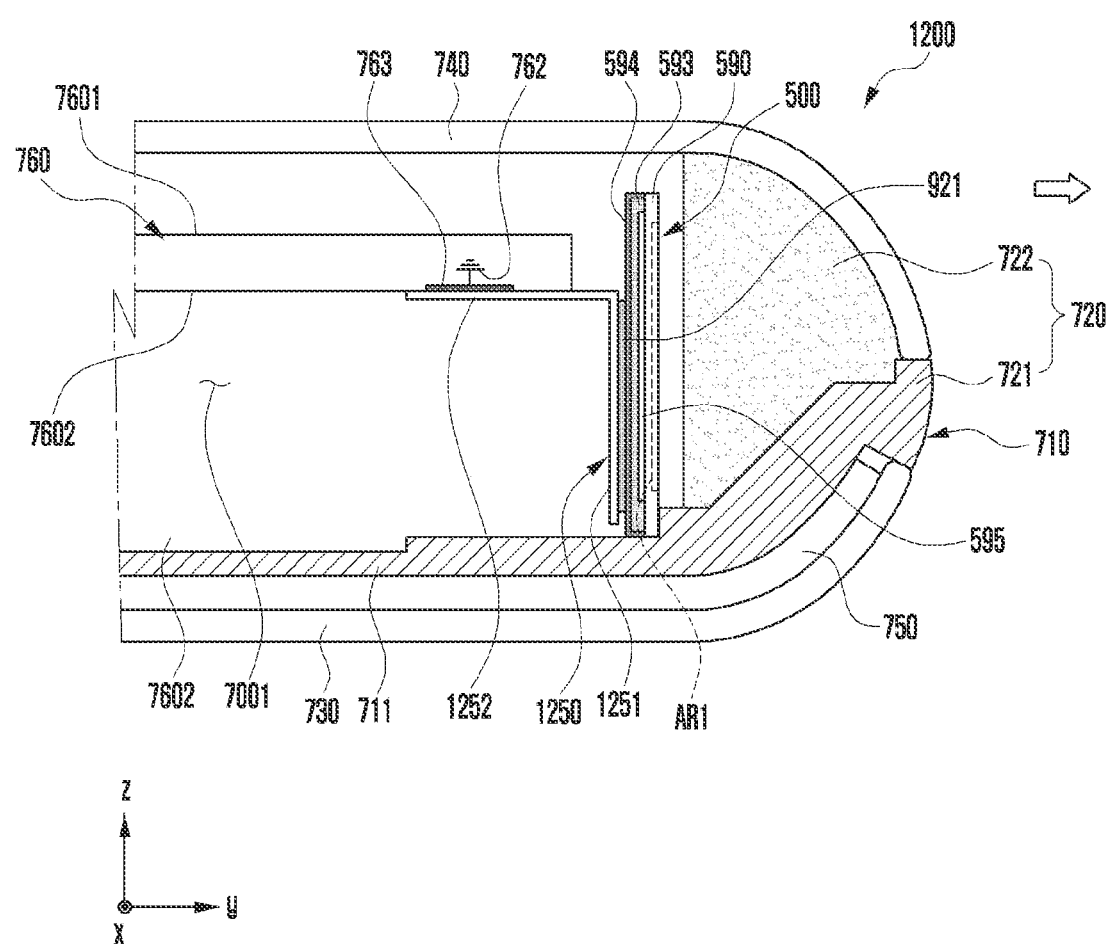

FIG. 12 is an illustration of a conductive member 1250 connected to the device substrate 760 whose arrangement position is changed in the electronic device 1200.

Referring to FIG. 12, the electronic device 1200 may include the plate-type conductive member 1250 that is attached to the conductive shielding layer 594 of the antenna module 500 and is electrically connected to the ground layer 762 of the device substrate 760. The conductive member 1250 may include a first portion 1251 connected to the conductive shielding layer 594 of the antenna module 500 through the first thermally conductive member 921, and a second portion 1252 extended from the first portion 1251 and electrically connected to the ground layer 762 of the device substrate 760. The second portion 1252 may be in contact with a ground pad 763 exposed to the second substrate surface 7602 of the device substrate 760. The second portion 1252 may be in contact with the ground pad 763 of the device surface 760 through a screw, soldering, conductive bonding, a conductive tape, a conductive sponge, a conductive TIM, or a conductive clip.

Noise emitted from the antenna module 500 may be shielded by a ground structure extended through the first portion 1251 and the second portion 1252 of the conductive member 1250 electrically connected from the conductive shielding layer 594 to the ground layer 762 of the device substrate 760. In addition, the high-temperature heat emitted from the antenna module 500 may be dissipated to the ground layer 762, formed in a relatively large area of the device substrate 760, through the conductive member 1250.

Figure 13:
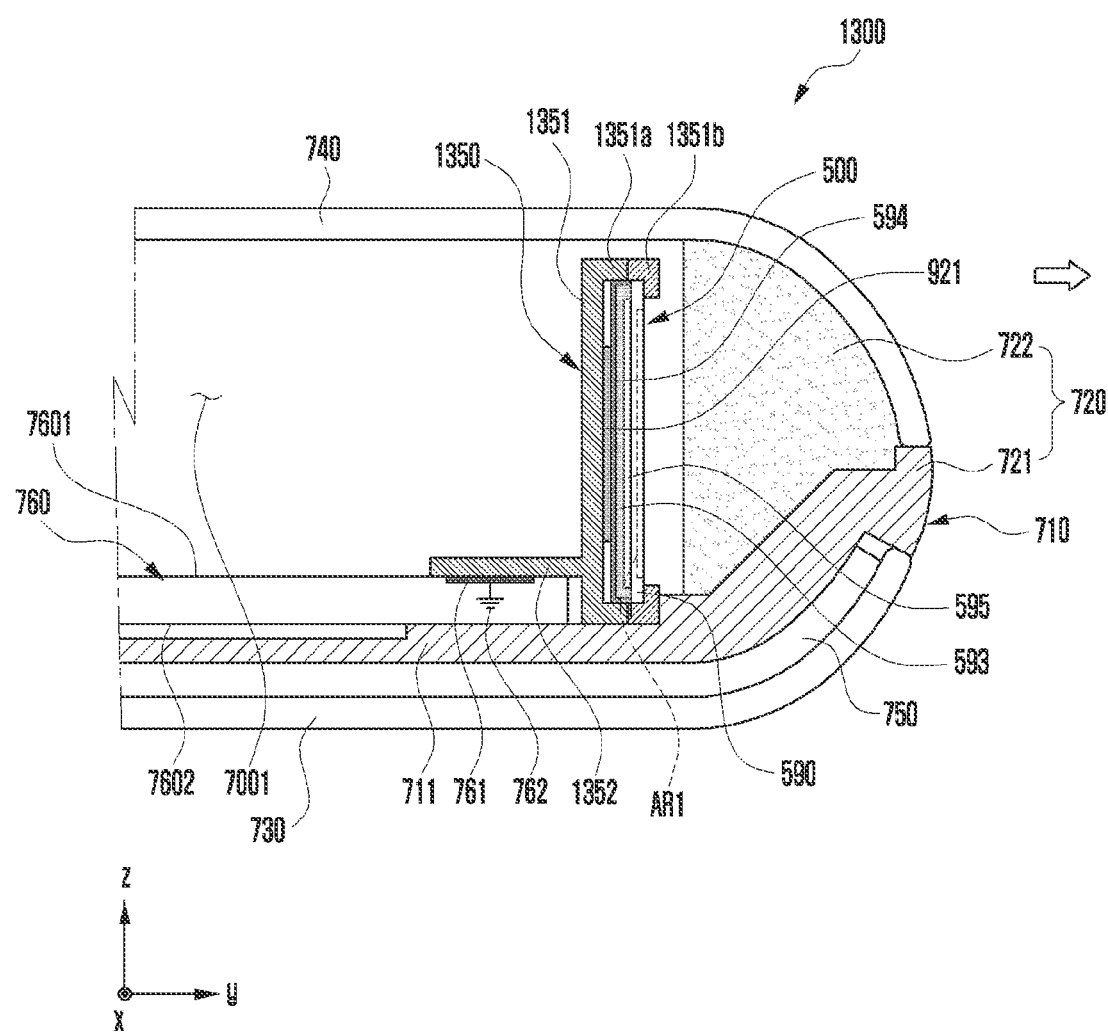

Referring to FIG. 13, the electronic device 1300 may include a conductive carrier 1350 that is attached to the conductive shielding layer 594 of the antenna module 500 and is electrically connected to the ground layer 762 of the device substrate 760. The conductive carrier 1350 may include a body 1351 that supports the antenna module 500 while surrounding the PCB 590 from the second surface 592 up to at least a portion of the first surface 591. In the conductive carrier 1350, a first portion 1351*a* of the body 1351 facing the conductive shielding layer 594 may be formed of a conductive material (e.g., metal), and a second portion 1351*b* of the body 1351 supporting the first surface 591 of the PCB 590 may be formed of a non-conductive material (e.g., polymer). This is to prevent the radiation performance of the antenna array AR1 from being degraded in a lateral direction through the first surface 591. The first portion 1351*a* and the second portion 1351*b* of the body 1351 may be integrally formed through an insert injection process of the conductive material and the non-conductive material. The conductive carrier 1350 may include a conductive extension 1352 extended from the first portion 1351*a* in a longitudinal direction of the device substrate 760. The conductive extension 1352 may be in contact with the ground pad 761 exposed to the first substrate surface 7601 of the device substrate 760. The conductive extension 1352 may be in contact with the ground pad 761 of the device substrate 760 through a screw, a conductive tape, soldering, a conductive sponge, a conductive TIM, or a conductive clip. As shown in FIG. 12, the conductive extension 1352 may be in contact with a ground pad 763 exposed to the second substrate surface 7602 of the device substrate 760.

Noise emitted from the antenna module 500 may be shielded by a ground structure extended through the first portion 1351*a* and the conductive extension 1352 of the conductive carrier 1350 electrically connected from the conductive shielding layer 594 to the ground layer 762 of the device substrate 760. In addition, the high-temperature heat emitted from the antenna module 500 may be dissipated to the ground layer 762, formed in a relatively large area of the device substrate 760, through the conductive carrier 1350.

Figure 14:
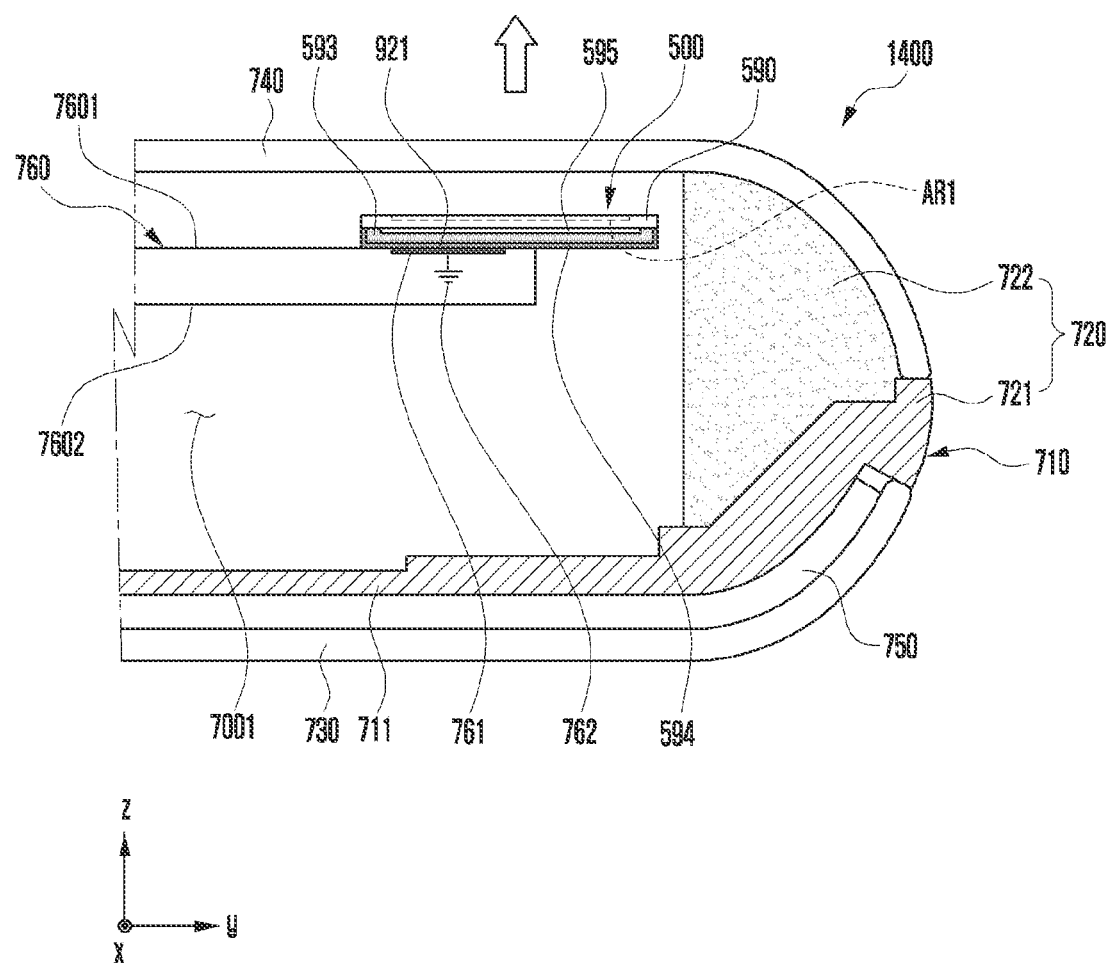
FIG. 14 is a cross-sectional view partially showing an electronic device including an antenna module according to an embodiment.

FIG. 14 is a cross-sectional view partially showing an electronic device 1400 including an antenna module 500 according to an embodiment.

Referring to FIG. 14, the electronic device 1400 may be similar, at least in part, to the electronic device 101 of FIG. 1 or the electronic device 300 of FIG. 3A, or may include other embodiments of the electronic device 1400.

The electronic device 1400 may include the device substrate 760 and the antenna module 500 mounted, at least in part, on the device substrate 760. The device substrate 760 may be disposed in parallel with the rear plate 740 in the inner space 7001. When the rear plate 740 is viewed from above, the antenna module 500 may be disposed to be overlapped, at least in part, with the first substrate surface 7601 of the device substrate 760, so that a beam pattern of the antenna module 500 may be formed in a direction (denoted by an arrow) of the rear plate 740.

The antenna module 500 may be disposed such that at least a portion of the conductive shielding layer 594 is in direct contact with the ground pad 761 exposed to the first substrate surface 7601 of the device substrate 760. For example, the conductive shielding layer 594 of the antenna module 500 may be in contact with the ground pad 761 of the device substrate 760 through a thermally conductive member 921 such as a screw, a conductive tape, soldering, a conductive sponge, a conductive TIM, or a conductive clip. A certain conductive member may be further disposed between the conductive shielding layer 594 and the ground pad 761. In this case, the above-described thermally conductive member 921 may be further interposed between the conductive shielding layer 594 and the conductive member.

The first thermally conductive member 921 and/or the second thermally conductive member 922 described with reference to FIGS. 9 to 14 may be replaced with the thermally conductive member 560 for electric shock prevention described above with reference to FIG. 7.

As described hereinbefore in various embodiments of the disclosure, noise shielding and a heat dissipation structure may be provided in an antenna module. This structure may not only prevent radiation performance from being degraded due to signal interference with other nearby antenna modules, but also effectively remove high-temperature heat generated from the antenna module.

According to various embodiments of the disclosure, an electronic device may include a housing that includes a conductive portion. The electronic device may include an antenna module disposed in an inner space of the housing. The antenna module may include a printed circuit board (PCB) disposed in the inner space and including a first surface and a second surface facing a direction opposite to the first surface, at least one antenna element disposed on the first surface of the PCB or near the first surface in the PCB, a wireless communication circuit disposed on the second surface and configured to transmit and/or receive a radio signal through the at least one antenna element, a protective member disposed on the second surface of the PCB to surround at least partially the wireless communication circuit, and a conductive shielding layer disposed on the protective layer. The electronic device may further include a conductive member connected to the conductive portion of the housing and facing the conductive shielding layer of the antenna module at least in part.

According to various embodiments, the housing may include a non-conductive portion (e.g., the polymer portion 722 in FIG. 7) connected to the conductive portion, and the antenna module may be disposed such that the at least one antenna element forms a beam pattern through the non-conductive portion.

According to various embodiments, the electronic device may further include a thermally conductive member for electric shock prevention positioned to contact the conductive shielding layer and the conductive member. At least a part of a noise generated by the wireless communication circuit in a direction different from a radiation direction of the antenna module may be passed to the conductive member through the thermally conductive member, and a current passed to the conductive member through the thermally conductive member may be reduced.

According to various embodiments, the thermally conductive member for electric shock prevention may include a first layer formed of a conductive material and facing the conductive shielding layer, and a third layer formed of a dielectric material, interposed between the first and second layers, and containing at least one of thermally conductive fillers.

According to various embodiments, the third layer may have a first dielectric constant, and the at least one thermally conductive filler may have a second dielectric constant higher than the first dielectric constant.

According to various embodiments, the thermally conductive member for electric shock prevention may have a specific capacitance, and an alternating current (AC) coupling may be formed between the conductive shielding layer and the conductive member, based on the specific capacitance.

According to various embodiments, the specific capacitance may have a range of 40 pF to 60 pF.

According to various embodiments, a heat generated by at least a part of the antenna module may be transferred to the conductive member through the thermally conductive member for electric shock prevention.

According to various embodiments, the electronic device may further include a thermally conductive member interposed between the conductive member and the conductive portion.

According to various embodiments, the PCB may include a ground layer, and the conductive shielding layer may be electrically connected to the ground layer.

According to various embodiments of the disclosure, an electronic device may include a housing. The electronic device may further include a device substrate disposed in an inner space of the housing and including a first ground layer, and an antenna module disposed adjacent to the device substrate. The antenna module may include a printed circuit board (PCB) disposed in the inner space and including a first surface and a second surface facing a direction opposite to the first surface, at least one antenna element disposed on the first surface of the PCB or near the first surface in the PCB, a wireless communication circuit disposed on the second surface and configured to transmit and/or receive a radio signal through the at least one antenna element, a protective member disposed on the second surface of the PCB to surround at least partially the wireless communication circuit, and a conductive shielding layer disposed on the protective layer. The electronic device may further include a conductive member disposed in the inner space and including a first portion electrically connected to the conductive shielding layer and a second portion connected to the first portion and electrically connected to the first ground layer of the device substrate.

According to various embodiments, the device substrate may further include a ground pad electrically connected to the first ground layer and exposed to outside, and the second portion may be in contact with and/or fixed to the ground pad.

According to various embodiments, the second portion may be electrically connected to the ground pad through at least one of a screw, soldering, conductive bonding, a conductive tape, a conductive sponge, or a conductive clip.

According to various embodiments, the electronic device may further include a thermally conductive member interposed between the first portion and the conductive shielding layer.

According to various embodiments, the thermally conductive member may include at least one of a conductive tape, a thermal interface material (TIM), or a conductive sponge.

According to various embodiments, the electronic device may further include a vapor chamber disposed in the inner space, and the conductive member may further include a third portion extended from the first portion and/or the second portion and being in physical contact with the vapor chamber.

According to various embodiments, the conductive member may further include a third portion extended from the first portion and formed to surround at least a portion of the first surface of the PCB.

According to various embodiments, the third portion may include a polymer portion insert-injected into the first portion.

According to various embodiments, the housing may include a conductive portion and a polymer portion connected to the conductive portion, and the antenna module may be disposed such that the at least one antenna element forms a beam pattern through the polymer portion.

According to various embodiments, the PCB may include a second ground layer, and the conductive shielding layer may be electrically connected to the second ground layer.

According to various embodiments of the disclosure, a portable communication device may include a housing including a conductive portion forming at least a part of a lateral surface of the portable communication device. The portable communication device may include an antenna module disposed in the housing and including a printed circuit board (PCB) having a first surface facing the lateral surface and a second surface facing a direction opposite to the first surface, one or more antennas disposed on at least a portion of the PCB to transmit or receive a signal through the lateral surface, and a communication circuit disposed on the second surface and electrically connected to the one or more antennas. The portable communication device may further include a shielding member surrounding at least in part the communication circuit, a support member supporting the antenna module and having a conductive material, and an electric shock prevention member positioned to contact the shielding member and the support member. At least a part of a noise generated by the communication circuit in a direction different from a radiation direction of the antenna module may be passed to the support member through the electric shock prevention member, and a current passed to the support member through the electric shock prevention member may be reduced.

According to various embodiments, the at least a part of a noise may have a specified frequency band.

According to various embodiments, a heat generated by at least a part of the antenna module may be passed to the support member through the electric shock prevention member.

According to various embodiments, the electric shock prevention member may have a specific capacitance, and an alternating current (AC) coupling may be formed between the shielding member and the support member, based on the specific capacitance.

According to various embodiments, the specific capacitance may have a range of 40 pF to 60 pF.

According to various embodiments, the electric shock prevention member may include a first conductive layer, a second conductive layer, a non-conductive layer positioned between the first conductive layer and the second conductive layer, and at least one thermally conductive member penetrating through the non-conductive layer and connected to the first and second conductive layers.

According to various embodiments, the non-conductive layer may have a first dielectric constant, and the at least one thermally conductive member may have a second dielectric constant higher than the first dielectric constant.

According to various embodiments, at least one of the first and second conductive layers may include an anisotropic conductive film.

According to various embodiments, the at least one thermally conductive member may include ceramic.

According to various embodiments, the electronic device may further include a non-conductive portion positioned between the housing and the antenna module.

According to various embodiments, the electronic device may further include a protective member positioned between the second surface and the shielding member to surround at least a part of the communication circuit.

According to various embodiments, the shielding member may be formed as a part of the antenna module such that a first ending portion and a second ending portion of the shielding member contact the second surface in a first direction.

According to various embodiments, the electronic device may further include a protective member that may be formed as a part of the antenna module so as to contact the shield member in a second direction opposite to the first direction.

According to various embodiments, the support member may be extended integrally from the conductive portion.

According to various embodiments, the housing may include a support portion extended from the conductive portion into the housing and parallel to a front surface of the portable communication device, and the support member may be positioned at least partially oblique to the support portion.

According to various embodiments of the disclosure, a portable communication device may include a housing including a conductive portion forming at least a part of a lateral surface of the portable communication device. The portable communication device may include an antenna module disposed in the housing and including a printed circuit board (PCB) having a first surface facing the lateral surface and a second surface facing a direction opposite to the first surface, one or more antennas disposed on at least a portion of the PCB to transmit or receive a signal through the lateral surface, and a communication circuit disposed on the second surface and electrically connected to the one or more antennas. The portable communication device may further include a shielding member surrounding at least in part the communication circuit, a support member supporting the antenna module and having a conductive material, and an electric shock prevention member positioned to contact the shielding member and the support member and having a specific capacitance. An alternating current (AC) coupling may be formed between the shielding member and the support member, based on the specific capacitance.

According to various embodiments, the specific capacitance may have a range of 40 pF to 60 pF.

According to various embodiments of the disclosure, a portable communication device may include an antenna module including a printed circuit board (PCB) having a first surface and a second surface facing a direction opposite to the first surface, one or more antennas disposed on at least a portion of the PCB to transmit or receive a signal through the first surface, and a communication circuit disposed on the second surface and electrically connected to the one or more antennas. The portable communication device may further include a shielding member surrounding at least in part the communication circuit, and an electric shock prevention member positioned to contact the shielding member. At least a part of a noise generated by the communication circuit in a direction different from a radiation direction of the antenna module may be passed through the electric shock prevention member, and a current passed through the electric shock prevention member may be reduced.

According to various embodiments of the disclosure, an antenna module may include a printed circuit board (PCB) having a first surface and a second surface facing a direction opposite to the first surface, one or more antennas disposed on at least a portion of the PCB to transmit or receive a signal through the first surface, a communication circuit disposed on the second surface and electrically connected to the one or more antennas, a shielding member surrounding at least in part the communication circuit, and an electric shock prevention member positioned to contact the shielding member. At least a part of a noise generated by the communication circuit in a direction different from a radiation direction of the antenna module may be passed through the electric shock prevention member, and a current passed through the electric shock prevention member may be reduced.

According to various embodiments, the electric shock prevention member may have a specific capacitance, and based on the specific capacitance, an alternating current (AC) coupling may be formed between the support member and the shielding member both of which contact the electric shock prevention member.

While the disclosure has been particularly shown and described with reference to embodiments thereof, it will be understood by those skilled in the art that various changes in form and details may be made therein without departing from the scope of the subject matter as defined by the appended claims.

What is claimed is:

1. An electronic device, comprising:
 a housing including a conductive portion extended from at least a portion of a lateral surface of the electronic device to an inner space of the electronic device;
 an antenna module accommodated in the housing, the antenna module including:
  a printed circuit board (PCB) including a first side and a second side opposite to the first side;
  one or more antenna elements disposed at the first side of the PCB; and
  a wireless communication circuit disposed at the second side of the PCB and configured to transmit and/or receive a radio signal through at least one antenna element of the one or more antenna elements; and
 a conductive member accommodated in the housing and including a supporting portion and a connecting portion extended from the supporting portion and connected to the conductive portion of the housing, the supporting portion configured to support the antenna module such that the first side of the PCB faces in a direction toward the lateral surface of the electronic device, and the connecting portion including a hole through which a fastening member is disposed to fasten the conductive member to the conductive portion of the housing, wherein heat generated by the antenna module is transferred to the conductive portion of the housing via the conductive member.

2. The electronic device of claim 1, wherein a portion of the conductive portion of the housing is extended such that the portion forms at least part of a rear surface of the electronic device.

3. The electronic device of claim 1, wherein the antenna module is disposed on the conductive member such that the PCB is substantially parallel to the supporting portion of the conductive member.

4. The electronic device of claim 1, wherein the connecting portion includes a first connecting portion and a second connecting portion separated from the first connecting portion, wherein the hole includes a first hole formed in the first connecting portion and a second hole formed in the second connecting portion, and wherein the fastening member includes a first fastening member disposed through the first hole and a second fastening member disposed through the second hole.

5. The electronic device of claim 4, wherein the first connecting portion is extended from a first end of the supporting portion, and the second connecting portion is extended from a second end of the supporting portion opposite to the first end.

6. The electronic device of claim 4, wherein each of the first and second connecting portions is formed as substantially parallel to a rear surface of the electronic device.

7. The electronic device of claim 1, wherein the supporting portion faces in a first direction, and wherein the connecting portion includes a first portion having the hole and a second portion connected between the supporting portion and the first portion, the first portion facing in the first direction and the second portion facing in a second direction substantially perpendicular to the first direction.

8. The electronic device of claim 1, wherein the antenna module includes a conductive shielding layer disposed between the wireless communication circuit and the supporting portion of the conductive member.

9. The electronic device of claim 1, wherein the housing includes a non-conductive portion disposed in contact with the conductive portion such that the at least one antenna element is to radiate a beam in the direction toward the lateral surface of the electronic device via the non-conductive portion.

10. The electronic device of claim 9, wherein the non-conductive portion is composed of a polymer.

11. The electronic device of claim 1, further comprising a sponge member disposed between the antenna module and the conductive member.

12. The electronic device of claim 1, wherein the conductive member is composed of a metal.

13. An electronic device comprising:
a housing including a conductive portion extended from at least a portion of a lateral surface of the electronic device to an inner space of the electronic device;
an antenna module accommodated in the housing, the antenna module including:
a printed circuit board (PCB) including a first side and a second side opposite to the first side:
one or more antenna elements disposed in the PCB;
a wireless communication circuit disposed at the second side of the PCB and configured to transmit and/or receive a radio signal through at least one antenna element of the one or more antenna elements; and
a conductive shielding layer configured to cover at least one portion of the wireless communication circuit;
a conductive member disposed in the housing, adjacent to the antenna module, covering at least one side of the conductive shielding layer, the conductive member including a supporting portion substantially parallel with the antenna module, and a connecting portion extended from the supporting portion and connected to the conductive portion of the housing, the supporting portion configured to support the antenna module such that the first side of the PCB faces in a direction toward the lateral surface of the electronic device, and the connecting portion including a first hole formed therein;
a substrate disposed in contact with the conductive member, the substrate including a second hole formed thereon and
a fastening member disposed through the first hole and the second hole to fasten the conductive member and the substrate to the conductive portion of the housing.

14. The electronic device of claim 13, wherein the substrate is electrically connected with the antenna module via an electrical connection member.

15. The electronic device of claim 13, wherein the antenna module is disposed adjacent to the conductive member such that the PCB is substantially parallel with the supporting portion of the conductive member.

16. The electronic device of claim 13, wherein the housing includes a non-conductive portion disposed in contact with the conductive portion such that the at least one antenna element radiates a beam in the direction toward the lateral surface of the electronic device via the non-conductive portion.

17. The electronic device of claim 13, further comprising a sponge member disposed between the antenna module and the conductive member.

* * * * *